(12) United States Patent
Wen

(10) Patent No.: US 7,938,906 B2
(45) Date of Patent: May 10, 2011

(54) METHOD AND APPARATUS FOR DYNAMIC THIN-LAYER CHEMICAL PROCESSING OF SEMICONDUCTOR WAFERS

(75) Inventor: Sophia Wen, Sandy, OR (US)

(73) Assignees: Wuxi Huayingmicro, Ltd., Jiangsu (CN); Sophia Wen

( * ) Notice: Subject to any disclaimer, the term of this patent is extended or adjusted under 35 U.S.C. 154(b) by 846 days.

(21) Appl. No.: 10/865,013

(22) Filed: Jun. 10, 2004

(65) Prior Publication Data

US 2004/0253747 A1   Dec. 16, 2004

Related U.S. Application Data

(60) Provisional application No. 60/478,384, filed on Jun. 13, 2003.

(51) Int. Cl.
  *C23C 16/00* (2006.01)
  *H01L 21/00* (2006.01)
(52) U.S. Cl. ........................ 118/719; 118/733; 118/715
(58) Field of Classification Search .................. 118/733, 118/715, 719; 156/345; 438/13
  See application file for complete search history.

(56) References Cited

U.S. PATENT DOCUMENTS

| 5,169,408 A | 12/1992 | Biggerstaff et al. |
| 6,176,934 B1 * | 1/2001 | Nelson ........................... 118/733 |
| 6,248,670 B1 | 6/2001 | Hung et al. |
| 6,337,003 B1 * | 1/2002 | Kinokiri et al. .......... 204/298.15 |
| 6,666,922 B2 * | 12/2003 | Curtis et al. .................. 118/719 |
| 2002/0189638 A1 | 12/2002 | Luscher et al. |

FOREIGN PATENT DOCUMENTS

| EP | 0 360 678 A1 | 3/1990 |
| WO | WO 97/14178 A1 | 4/1997 |

* cited by examiner

*Primary Examiner* — Sylvia R. MacArthur
(74) *Attorney, Agent, or Firm* — Wuxi Sino IP Agency, Ltd.; Joe Zheng

(57) ABSTRACT

A semiconductor wafer processing and analysis apparatus (20) includes a processing micro chamber (22) for closely receiving a semiconductor wafer (27) therein. The chamber may be opened for loading and removing the semiconductor wafers and then closed for processing of the wafer wherein chemical reagents and other fluids are introduced into the chamber. Small clearances are provided between the upper surface, the lower surfaces, and the perimeter edge of the wafer and the corresponding portions of the processing chamber. A high-speed collection system is provided for collecting and removing the spent reagents and fluids from the chamber for either on-line or off-line analysis or for waste treatment.

20 Claims, 14 Drawing Sheets

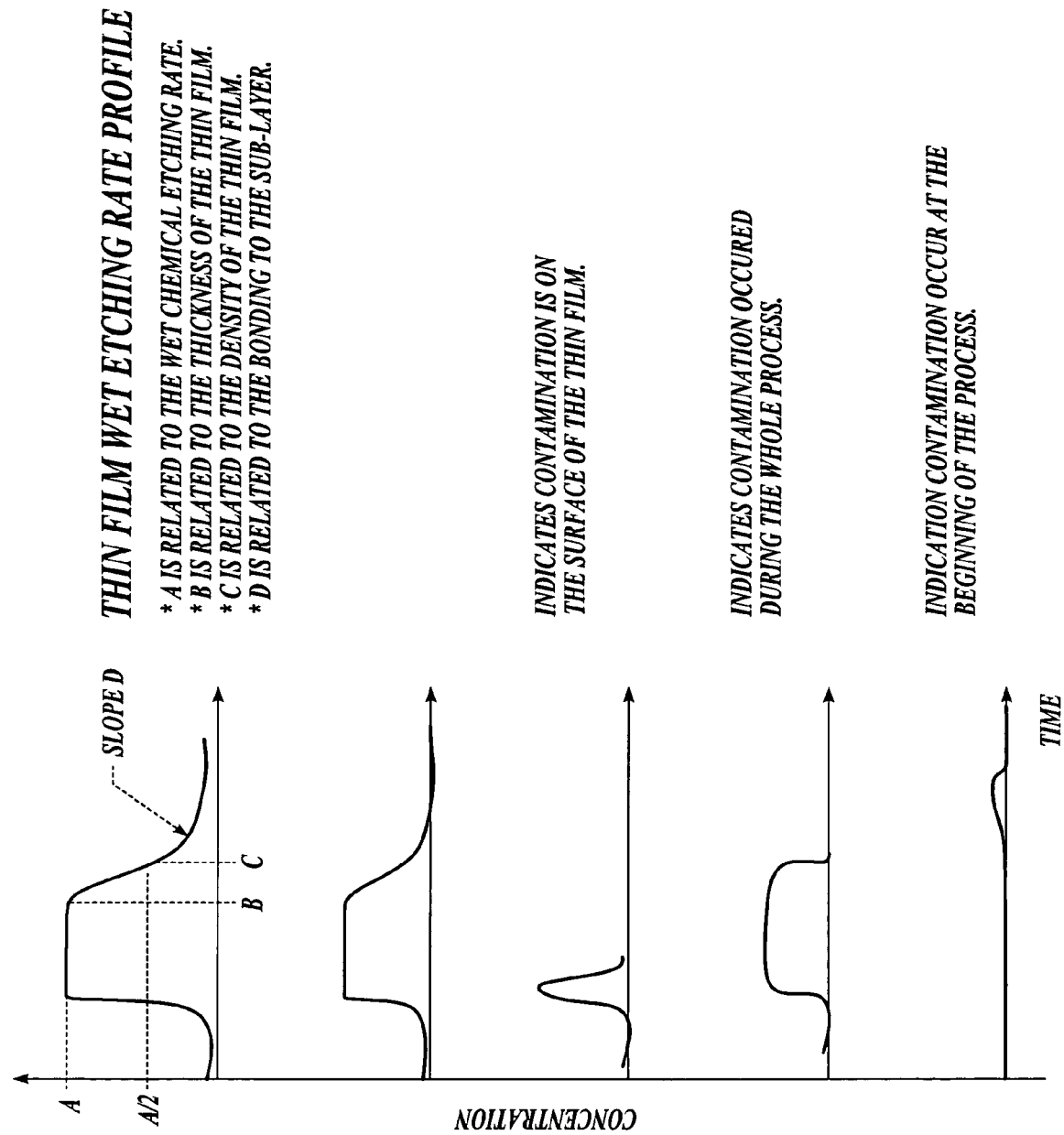

METHOD AND APPARATUS FOR DYNAMIC THIN-LAYER CHEMICAL PROCESSING OF SEMICONDUCTOR WAFERS

CROSS-REFERENCE TO RELATED APPLICATION

This application claims the benefit of U.S. Provisional Application No. 60/478,384, filed Jun. 13, 2003, which is incorporated herein by reference.

FIELD OF THE INVENTION

The present invention relates generally to processing semiconductor wafers or similar workpieces, and in particular, to a method and apparatus for chemical analysis of semiconductor wafer surfaces, as well as for cleaning, etching and otherwise processing semiconductor wafers with the ability to simultaneously in real time analyze the ongoing processes.

BACKGROUND OF THE INVENTION

Microchip fabrication processes are largely a matter of surfaces. Processing techniques are concerned with modifying properties less than a few microns below or above the surface of a substrate material. Present complex electronic integrated circuits are formed by using planar processes in which an ultra-clean, flat wafer of silicon is used as a substrate upon which a large number of identical devices are built by various oxidation, photolithography, removal, ion bombardment, deposition and other processes.

It is well known that device performance, reliability and product yield of silicon circuits are critically affected by the presence of chemical contaminants and particulate impurities on the wafer surface of the device. An ultra-clean surface preparation before and after the processes used for the patterning of microelectronics devices is now more important than ever before, as the surface diameter extends toward 300 mm and the structure dimensions shrink below sub-microns.

Existing methods for ultra-clean surface preparation can be divided into two main categories: wet processes such as immersion and spray techniques, and dry processes such as chemical vapor and plasma based techniques. Wet processing typically consists of a series of steps of immersing or spraying the wafers with appropriate chemical solutions. The wet processes for ultra-clean wafer surface preparation have been successfully used for the past thirty years and are still the predominant methods used in present integrated circuits manufacturing. However, the complexity of 90- and 65-nm semiconductor processes, that call for new materials and structures, such as copper interconnects, low-k dielectrics, high-k capacitors and more metal levels, has demanded creating new ways of measuring and removing contamination and other fatal defects, as well as the design of process steps that are not defect-sensitive. In addition, the economic realities of modern semiconductor manufacturing that dictate that devices must yield in the mid- to high- 90% range reflect the volatility and cyclical nature of the semiconductor business. As such, advanced process control and in situ process monitoring will be much more important than the traditional approach of longer-loop feedback based on final test and inspection data. There is a need to have a reliable in-line monitoring system to ensure critical equipment performance and process quality.

Thus, there is a need for the ability to clean and process semiconductor wafers efficiently in terms of materials, time, and labor required, as well as the ability to analyze and monitor the cleaning and/or processing of semiconductor wafers accurately and on a real-time basis. The present invention seeks to address these needs.

SUMMARY OF THE INVENTION

An apparatus for chemically processing a semiconductor wafer includes a micro chamber in which a semiconductor wafer is closely received and processed. The micro chamber comprises a first or upper section having portions defining an upper working surface, as well as an interior perimeter, and a second or lower section having portions defining a lower working surface and also having portions defining an interior perimeter. The processing chamber is shiftable between an open position for receiving or removing a semiconductor wafer therefrom, and a closed position for closely supporting the semiconductor wafer for chemical processing.

When the processing chamber is in closed position, the semiconductor wafer is positioned between the upper working surface and the lower working surface to define a narrow gap between the upper working surface and the adjacent surface of the semiconductor wafer, and/or a narrow gap between the lower working surface and adjacent surface of the semiconductor wafer. In addition, a narrow gap may exist between the outer perimeter of the semiconductor wafer and the interior perimeters of the chamber upper and lower sections.

At least one entrance opening is provided in the chamber first or upper section and chamber second or lower section for directing processing fluids into the chamber. At least the perimeter portions of the chamber lower section may be contoured to define a collection location for the spent processing fluid. From the collection location, the processing fluid may exit the chamber through an outlet, thereby to direct the spent processing fluid to an analyzer or for storage and eventual disposition. Also, the processing chamber includes at least one entrance opening for directing gas into the chamber in a manner so that the gas acts as a carrier for the processing fluid to carry the processing fluid into the contoured portions of the collection chamber lower section and then out the chamber outlet.

In accordance with a further aspect of the present invention, the contoured portions of the second or lower chamber are located in the outer perimeter portion of the lower chamber. Further, the contoured portions of the second or lower chamber may define at least one groove extending downwardly from the adjacent area of the second chamber. In a further aspect of the present invention, a groove may extend substantially around the perimeter portion of the second chamber.

In accordance with a further aspect of the present invention, the chamber second or lower section defines a sump which is in communication with the groove for collecting the spent processing fluid. In addition, a drain is in fluid flow communication with the sump for directing the spent fluid away from the sump.

In a further aspect, the present apparatus further includes an upper box structure for receiving and supporting the chamber first or upper section, and a lower box structure for receiving and supporting the chamber second or lower section. The upper and lower box sections are relatively moveable towards each other during closure of the chamber and relatively moveable away from each other during opening of the chamber.

In a further aspect of the present invention, at least one fluid bladder powers the upper and lower box structures relatively toward each other during closing of the chamber and retracts the upper and lower chambers relatively away from each other during opening of the chamber.

The present invention also includes a method for chemically processing a semiconductor wafer within the interior of a close-fitting processing chamber, with the processing chamber having an upper working surface, a lower working surface, and a perimeter extending around the upper and lower working surfaces. The method includes supporting the wafer between the upper and lower working surfaces such that a narrow gap is created between substantially the entire area of at least one surface of the wafer and the corresponding working surface. The wafer is also supported within the chamber interior such that a narrow gap is created between the outer edge portion of the wafer and the perimeter of the chamber interior.

The method of the present invention also includes injecting selected processing fluids into the chamber through at least one entrance opening in the chamber interior. The processing fluid is caused to flow through the narrow gap between the wafer and the chamber, and then pass the outer edge portion of the wafer. The thus-spent processing fluid that has flowed past the outer edge portion of the wafer is rapidly collected and removed from the chamber for availability for analysis and/or collection.

In accordance with a further aspect of the present invention, the step of collecting the processing fluid comprises collecting the processing fluid in a recessed portion of the lower working surface. The recessed portion of the lower working surface may extend around the perimeter of the chamber interior.

Also, the step of rapidly collecting the spent processing fluid may be carried out by introducing pressurized gas into the chamber interior, with the gas urging the spent processing fluid for collection and exiting the chamber. In a further aspect of the present invention, the step of rapidly collecting the spent processing fluid may include employing a vacuum to assist the collection of the spent processing fluid and causing the spent processing fluid to exit the chamber interior.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 14A is a plot of concentration of material removed from the semiconductor wafer substrate in a chemically etching process over time;

FIG. 14B is a plot similar to that shown in FIG. 14A, but of a different element or material removed from the semiconductor wafer substrate;

FIG. 14C is a plot similar to FIG. 14A, showing the removal of a contaminant from the semiconductor wafer substrate;

FIG. 14D is a plot similar to FIG. 14A but with a contaminant material removed from the semiconductor substrate; and FIG. 14E is a plot similar to FIG. 14A, showing a further contaminant material removed from the semiconductor wafer substrate.

DETAILED DESCRIPTION OF THE PREFERRED EMBODIMENT

Figure 1:
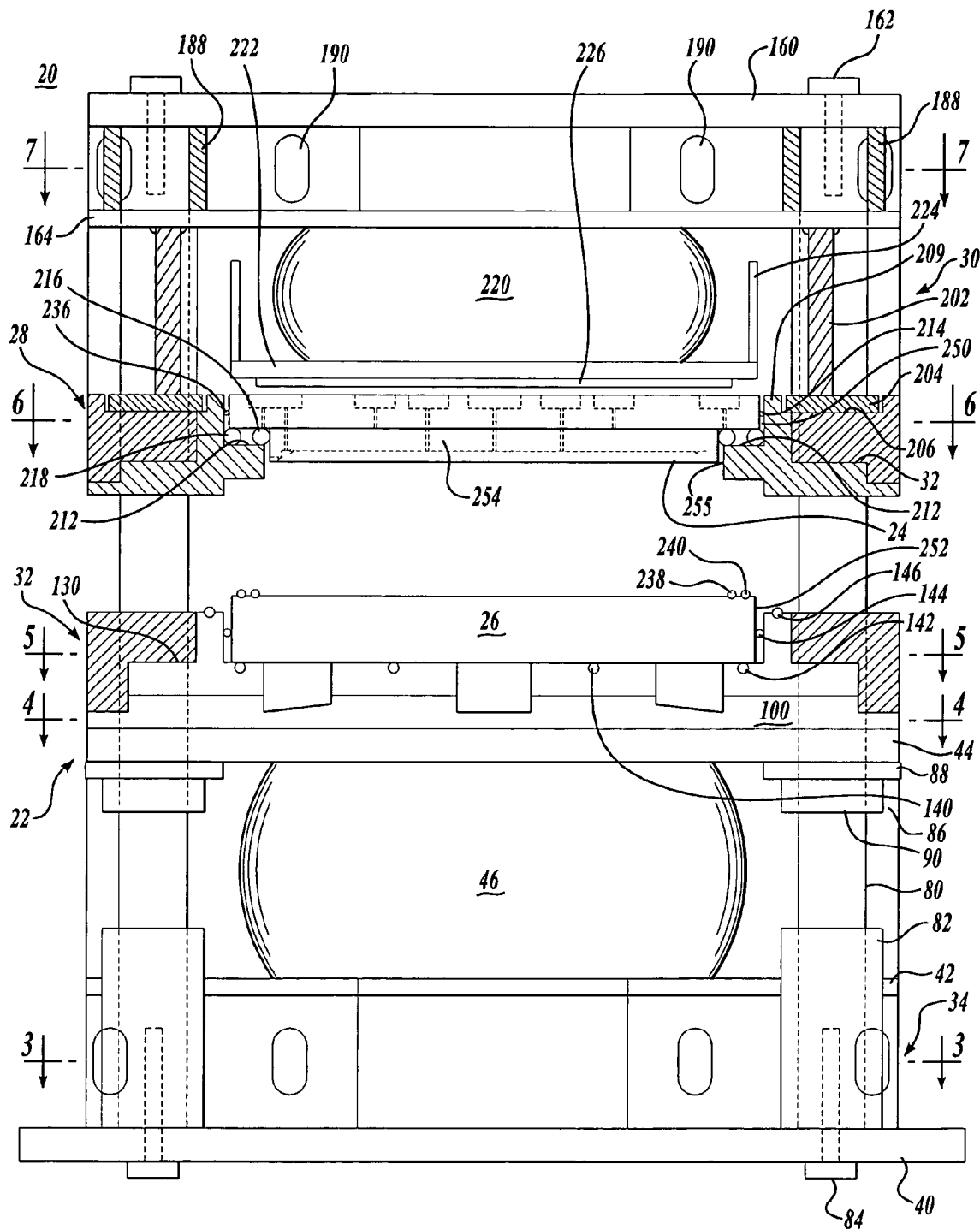
FIG. 1 is a schematic side elevational view of the present invention illustrated with the wafer-processing chamber in open position.
Figure 2:
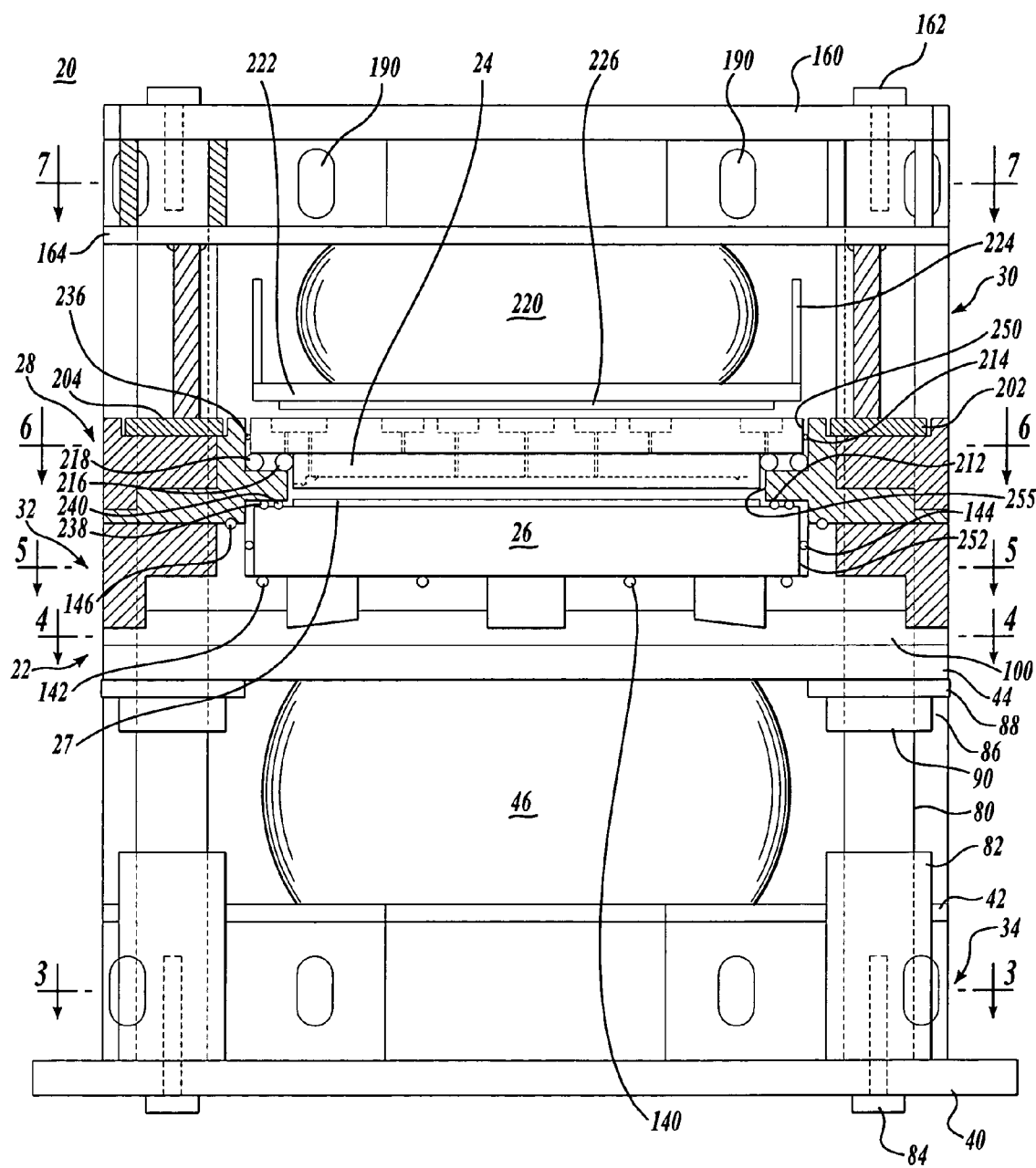
FIG. 2 is a view similar to FIG. 1, but with the wafer-processing chamber shown in closed position.

The semiconductor wafer chemical processing and analysis apparatus 20 of the present invention is shown schematically in side elevational views in FIGS. 1 and 2 in open and closed positions, respectively. Briefly, the apparatus 20 includes micro processing chamber 22 composed of a first or upper chamber 24 and a second or lower chamber 26 for closely receiving a semiconductor wafer 27 therebetween. The upper chamber 24 is supported by and within an upper box structure 28, which in turn is connected to and supported by an upper support structure 30. Correspondingly, the lower chamber 26 is disposed within a lower box structure 32, which in turn is supported and carried by a lower support structure 34.

The upper and lower support structures 30 and 34 are movable relative to each other to open and close the upper and lower box structures 28 and 32 as well as to open and close the upper and lower processing chambers 24 and 26 when loading and removing wafer 27 therefrom. When the micro processing chamber 22 is closed, chemical reagents and other fluids are introduced into the chamber for chemical analysis, cleaning, etching and otherwise processing the semiconductor wafer and simultaneously collecting the spent chemical reagents and other fluids for either on-line or off-line analyses, or for routing to a waste treatment system.

Figure 3:
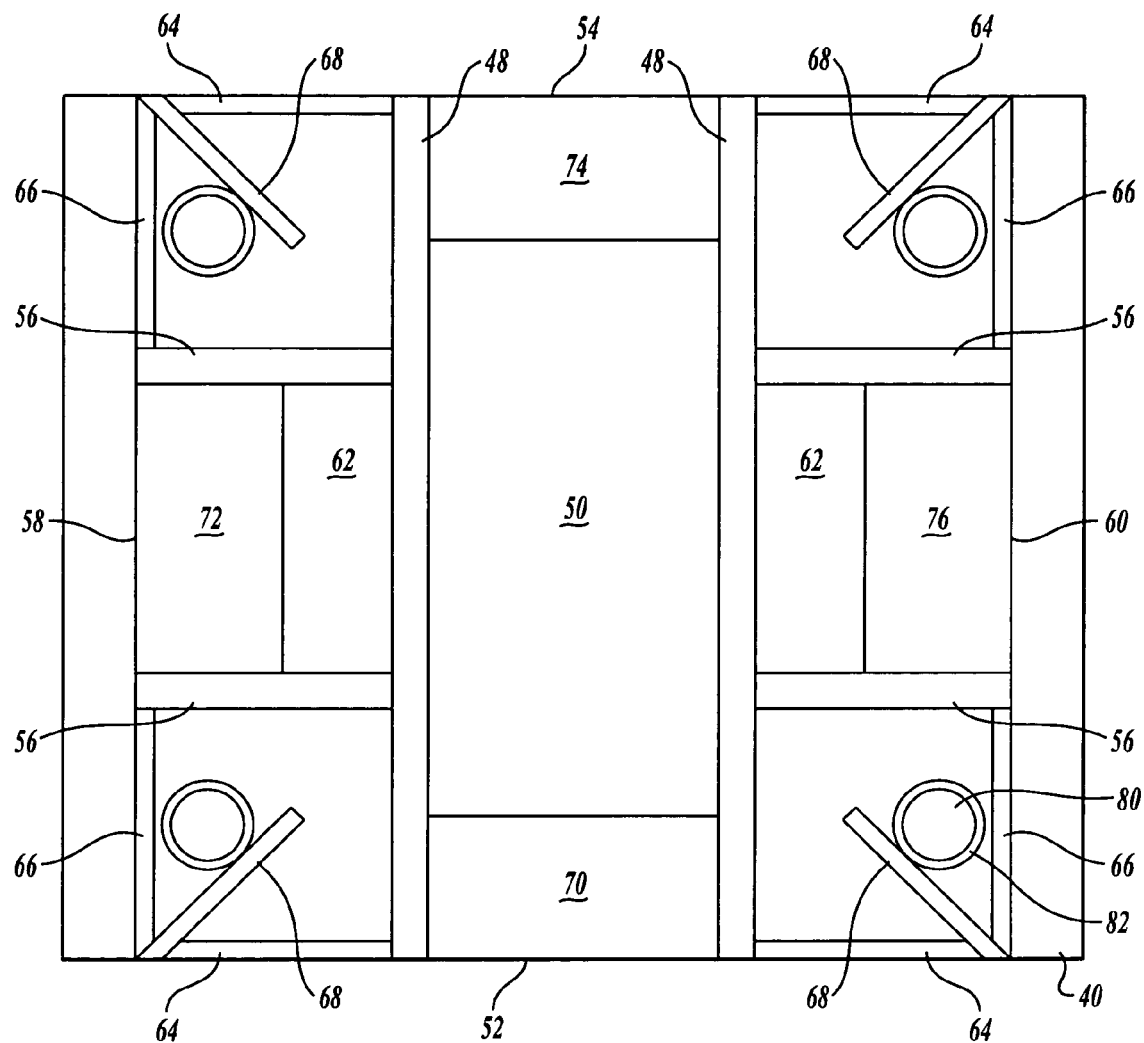
FIG. 3 is a cross-sectional view of FIG. 1 taken along lines 3F and 3 thereof.

Describing the apparatus 20 in more detail, the lower support structure 34 includes the bottom plate 40 and intermediate plate 42 spaced above the bottom plate, and an upper plate 44 spaced above the intermediate plate. As described more fully below, a lower air bag 46 is disposed between the intermediate plate 42 and upper plate 44 to raise and lower the upper plate 44 relative to the intermediate plate 42. Referring additionally to FIG. 3, the intermediate plate 42 is supported above the bottom plate 40 by a support structure that includes a pair of longitudinal bars 48 extending across the lower support structure 34 from one edge 52 of the bottom and intermediate plates 40 and 44 to the opposite edge 54 of the bottom and intermediate plates. The bars 48 form high strength support walls for the intermediate plate 42. A center block 50 extends between the walls 48 centrally relative to the bottom plate 40. Pairs of spaced-apart intermediate transverse bars 56 extend transversely in spaced, parallel relationship from intermediate portions of walls 48 to the outer edges 58 and 60 of the base plate 40. Continuing to refer to FIG. 3, support blocks 62 are positioned between adjacent intermediate bars 56 and abutting the outer sides of crossbars 48 to enhance the structural integrity of the lower support structure 34.

The corner portions of the intermediate plate 42 are supported relative to the base plate 40 by corner bars 64 and 66 extending along the outer edges of the intermediate plate to intersect a diagonal bar 68 extending diagonally inwardly from each of the corners of the intermediate plate 42. It will be appreciated that by the foregoing construction, the intermediate plate 42 is substantially supported above the base plate 40 while still defining cavities 70, 72, 74 and 76 about the perimeter portion of the lower support structure 34 to enable pressure pumps, vacuum pumps and other equipment to be installed within the lower support structure.

Columns 80 extend upwardly from each corner portion of the base plate 40 to the top of the upper support structure 30, as shown in the figures, including FIGS. 1 and 2. The columns 80 not only support the upper support structure 30 above the lower support structure 34, but also guide the travel of upper box structure 28 and lower box structure 32, as described below. A lower socket or cylinder 82 encases the lower portion of each column 80, thereby to strengthen the column. Ideally the cylinders 82 are fixedly and securely attached to the columns 80. The lower end of the columns 80 may be secured to the base plate 40 by any convenient means, including by use of threaded hardware members 84 that extend upwardly through clearance holes provided in the base plate 40 to engage threaded blind holes formed in the central and lower portions of the columns 80. Although the columns 80 are described as of solid construction, depending on their size and material composition the columns may be hollow or partially hollow.

The intermediate plate 42 and the lower box structure 32 supported thereby, are adapted to be raised and lowered relative to the upper support structure 30 by the lower air bag 46, which is shown in FIG. 1 as sandwiched between intermediate plate 42 and upper plate 44. Air can be supplied to the air bag 46 and exhausted from the air bag by standard equipment which will not be described in detail. Also, air bags of the nature of air bag 46 are standard articles of commerce.

To facilitate the raising and lowering of the upper plate 44, clearance holes are formed in the upper plate at the location of the columns 80. Slide rings 86 are positioned at each of these clearance holes to the underside of upper plate 44 to slidably engage over columns 80. Each of the slide rings 86 includes an upper flange portion 88 fixed to the undersurface of upper plate 44 and a hub portion 90 extending downwardly from the flange portion 88 to serve as a guide during sliding movement of the slide ring 86 over the column 80. It is to be understood that other types of guiding structures can be utilized, for example, various types of bushings or bearings.

Figure 4:
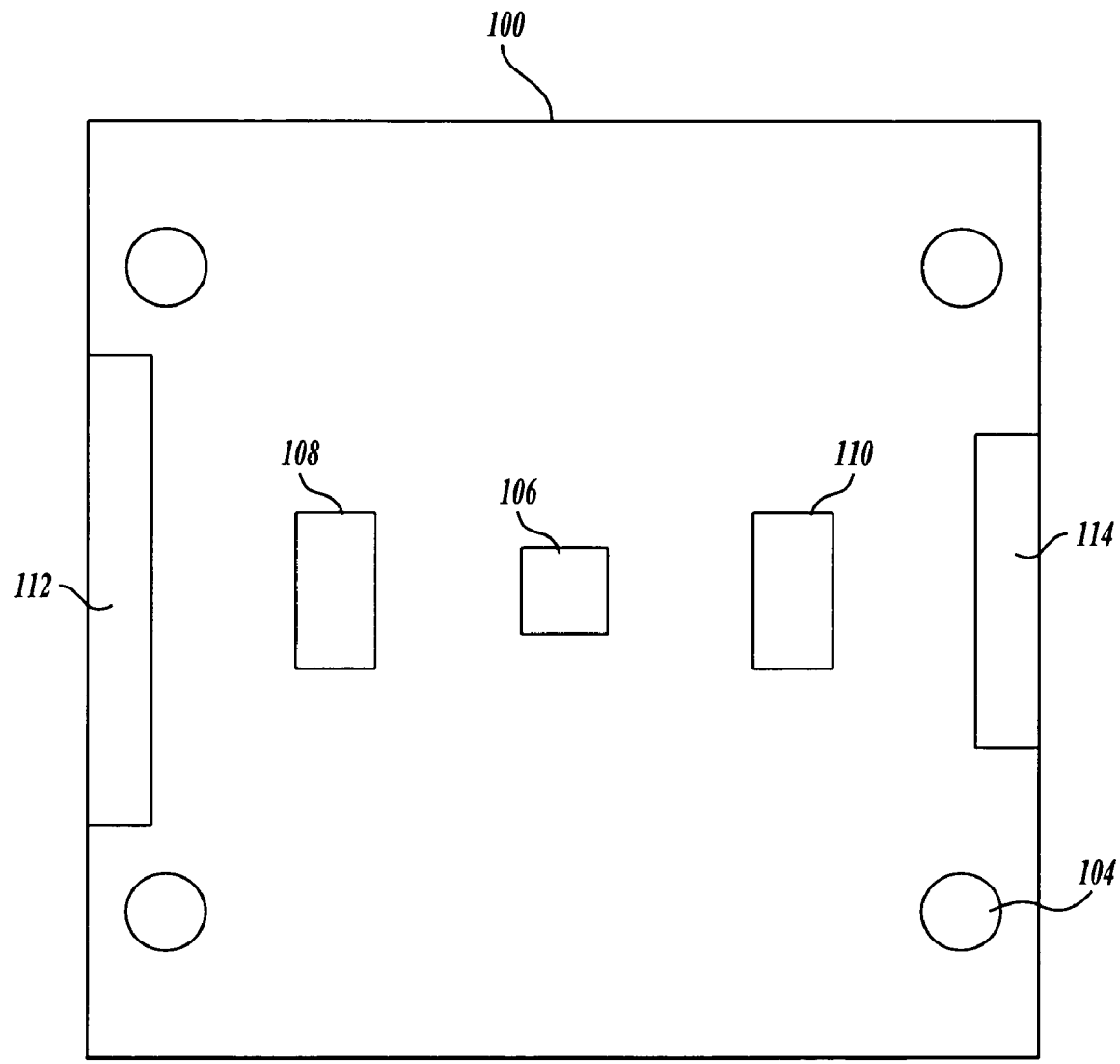
FIG. 4 is a cross-sectional view of FIG. 1 taken along lines 4-4 thereof.
Figure 5:
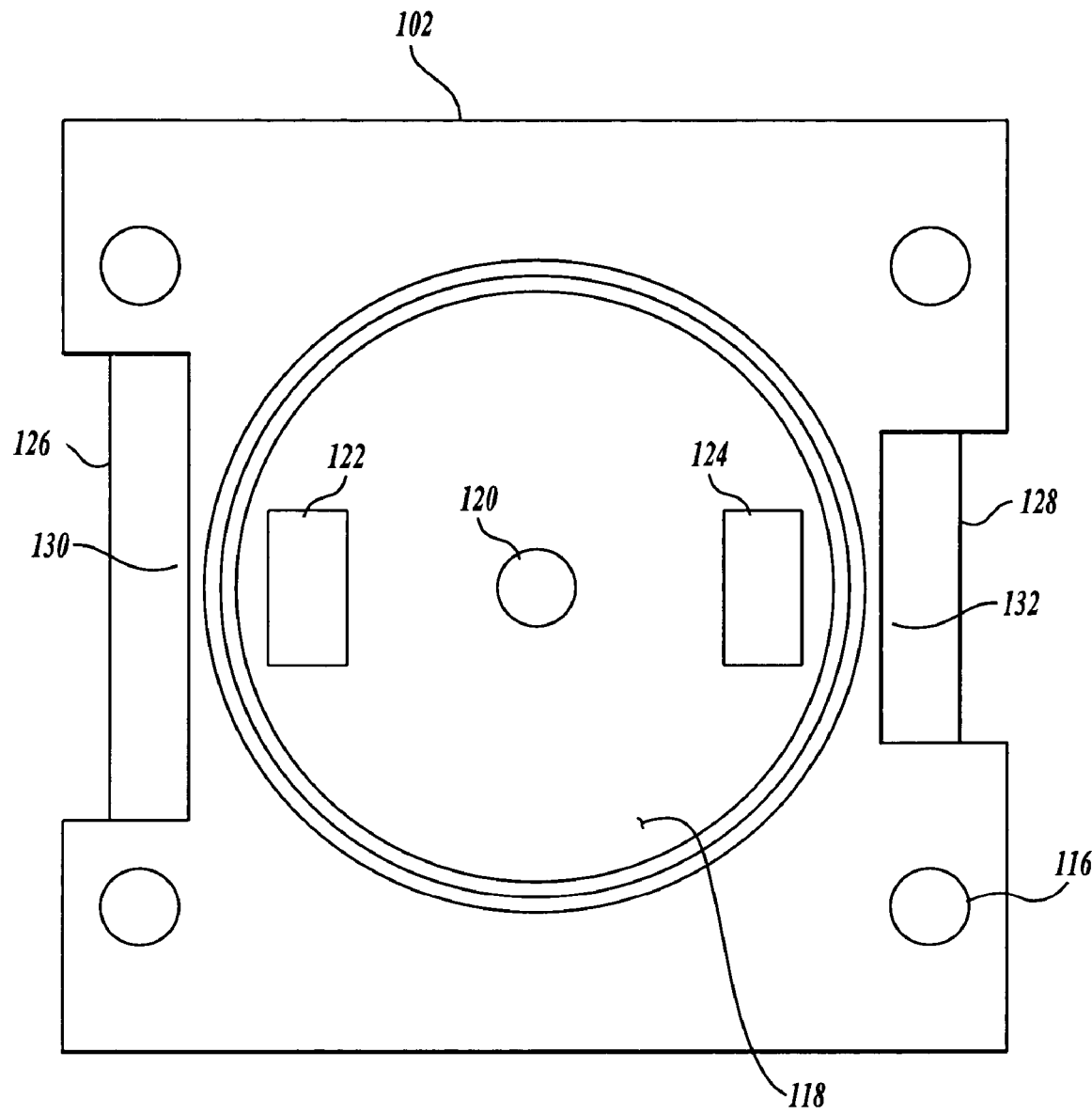
FIG. 5 is a cross-sectional view of FIG. 1 taken along lines 5-5 thereof.

Referring additionally to FIGS. 4 and 5, the lower box structure 32 includes a lower plate 100 which underlies the lower box structure. As shown in FIG. 4, the lower plate 100 is substantially planar and of a shape and size corresponding to the upper plate 44 of the lower support structure 34. The plate 100 includes clearance openings 104 for the columns 80. Also central and intermediate blind cavities 106, 108 and 110 are provided in the interior portion of plate 100 to accommodate drain lines, sensors or other fittings or equipment utilized in conjunction with the present invention, including as described below. Downwardly extending cutouts 112 and 114 are formed along the side edges of plate 100 for positioning the components that comprise the fluid, liquid, or gas distribution systems.

As noted above, the lower box 32 is supported on top of plate 100. The box 32 may be secured to plate 100 by any convenient means. Also, box 32 includes clearance openings 116 for columns 80. The box 32 has a central circular cavity 118 for receiving lower chamber 26, as described more fully below. Lower box 32 also includes a central throughhole 120 and intermediate throughholes 122 and 124 that correspond to the locations of blind cavities 106, 108 and 110, formed in plate 100, as described above. The lower box 32 also includes side cutouts 126 and 128 extending along the side portions of the box corresponding to the locations of the cutouts 112 and 114 formed in plate 100. In addition, the box 32 includes side shoulder portions 130 and 132 disposed along and inwardly of the side cutouts 126 and 128, respectively. These cutouts and shoulder portions are designed for positioning of components such as valves, flow controllers, sensors, etc., within apparatus 20 of the present invention.

Various O-rings may be used to seal the lower chamber 26 relative to the lower box 32, including a central lower O-ring 140 encircling opening 120 and an outer perimeter lower O-ring 142 extending around the lower perimeter of chamber 26. At least one O-ring 144 is disposed between the outer edge of the chamber 26 and lower box structure 32 to form a seal chamber within the chamber structure and the box structure.

Also, at least one O-ring 146 may be used to seal the lower box 32 relative to the upper box 28. The O-ring 146 is located at the interface of the upper surface of the lower box and the lower surface of the upper box. In this manner, the upper and lower boxes 28 and 32 are sealed together when closed, which in turn seals the upper and lower chambers, since these chambers are in turn sealed relative to their boxes, as noted herein.

Figure 6:
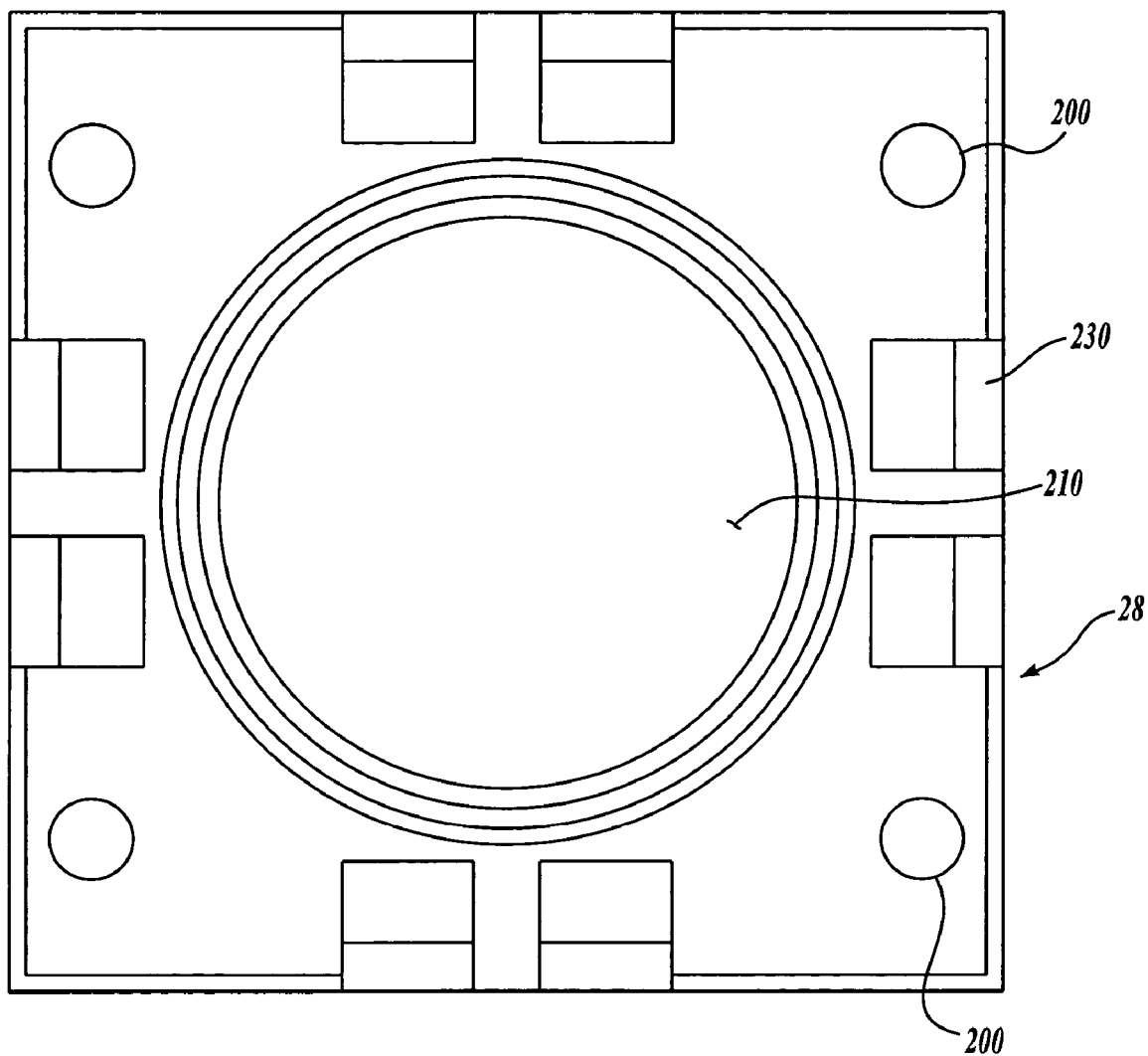
FIG. 6 is a cross-sectional view of FIG. 1 taken along lines 6-6 thereof.
Figure 7:
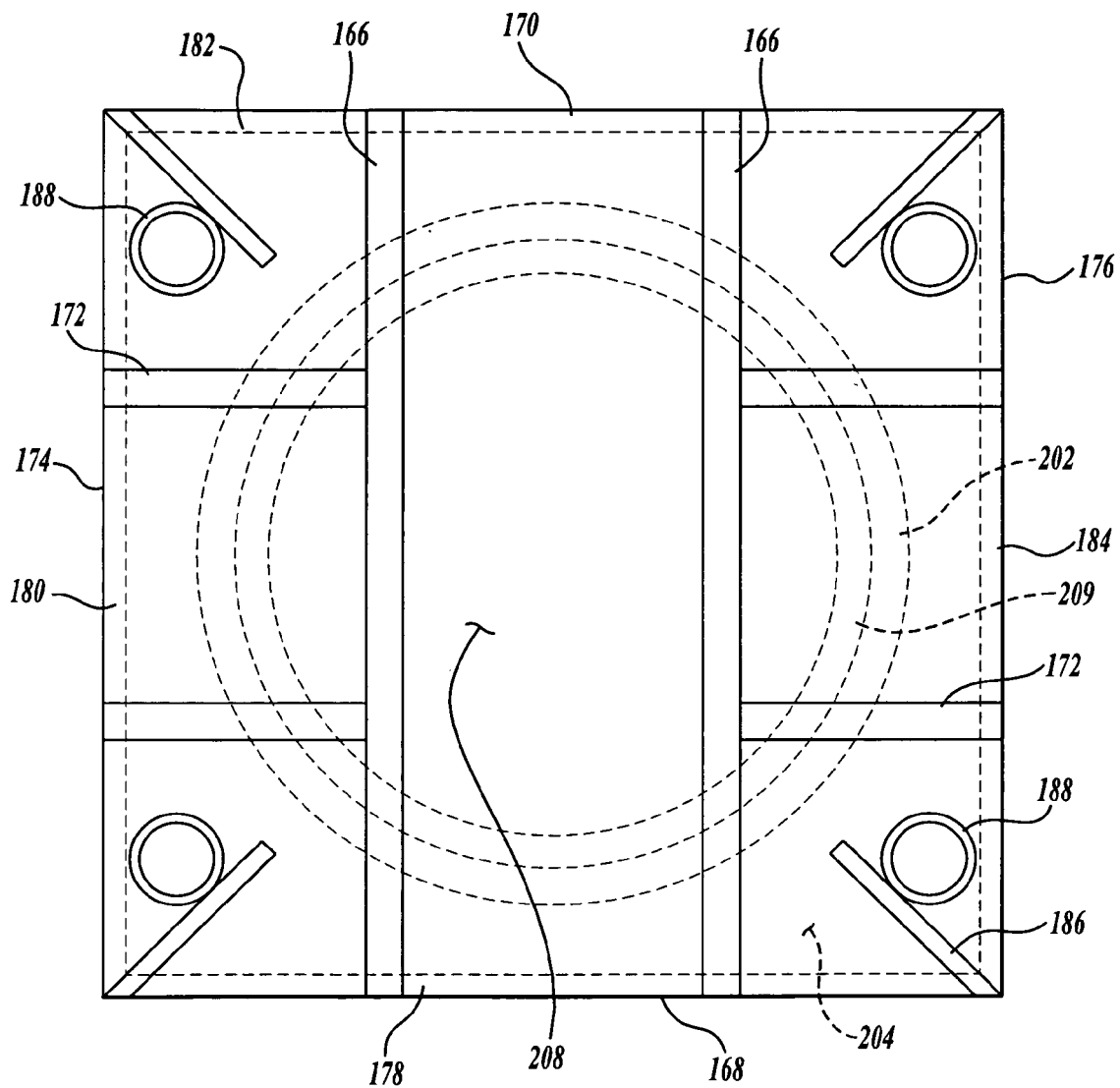
FIG. 7 is a cross-sectional view of FIG. 1 taken along lines 7-7 thereof.

Next describing the upper support structure 30, as shown in FIGS. 1, 2, 6 and 7, a top plate 160 is attached to the upper ends of columns 80 by threaded hardware members 162 that extend through close-fitting clearance holes formed in plate 160 to engage threaded blind holes formed in the columns. Other means for attaching the top plate 160 to the columns 80 may be utilized. An intermediate plate 164 is spaced below the top plate 160 by a structural arrangement similar to that utilized in the lower support structure 34 between the base plate 40 and intermediate plate 42. In this regard, as shown in FIG. 7, parallel, spaced-apart bars 166 extend across the intermediate portions of plates 160 and 164 from edges 168 to 170 of the plates. Pairs of intermediate bars 172 extend transversely from bars 166 to the outer edges 174 and 176 of the plates 160 and 164 in a manner similar to bars 56 shown in FIG. 3 above. Edge bars 178, 180, 182 and 184 extend around the perimeter of the plates 160 and 164. In addition, diagonal bars 186 extend diagonally inwardly from each of the corners of the upper support structure 30 to tangentially intersect reinforcing cylinders 188 which extend around the upper portions of the columns 80 and extend vertically from the underside of top plate 160 to the upper side of intermediate plate 164 to augment the column and bending strength of the columns 80. To provide further structural integrity, the reinforcing cylinders could be extended further downwardly along the columns 80. As shown in FIGS. 1 and 2, oblong openings 190 may be formed in edge bars 180-186 to provide passageways for fluid and other types of lines utilized in conjunction with the present invention.

Upper box 28 is spaced below intermediate plate 164. As shown in FIG. 6, the box 28 includes clearance holes 200 that are sized to closely receive column 80. The upper box 28 is supported from intermediate plate 164 by a cylinder 202 depending downwardly from the underside of intermediate plate 164 to intersect and support a clamping plate 204. As shown in dotted line in FIG. 7, the clamping plate 204 is generally rectangular in shape corresponding to the overall shape of the box structure 28 but a bit smaller in overall size to be receivable within downward recess 206 formed in the upper surface of the box structure. The inside portion of the clamping plate 204 is cut out in circle 208 to encircle an inner rim portion 209 of the box structure 28. The box 28 is attached to the underside of clamping plate 204 by a plurality of threaded hardware members (not shown), that extend through clearance openings formed in the clamping plate to engage within threaded blind holes formed in the upper portion of the box 28. In this manner, the upper box 28 is securely attached to and detachable from the upper support structure 30.

The upper box 28 includes a central opening 210 for receiving a central portion of the upper chamber 24. The upper box also includes a circular shoulder portion 212 for supporting the upper, larger diameter portion 214 of the upper chamber 24. A pair of O-rings 216 and 218 are interposed between the underside of the upper chamber larger diameter portion 214 and the shoulder portion 212 of the upper box 28. The O-rings may be of various cross-sectional diameters depending on the gap that is desired between the surfaces of the wafer 27 and the working surfaces of the upper and lower chambers 24 and 26, as discussed more thoroughly below. As will be appreciated, with changes in such gaps, different flow patterns of the fluids used in the processing chamber may be achieved, for example, a flow pattern that achieves laminar fluid flow versus turbulent fluid flow.

A second air bag 220 is interposed between the underside of intermediate plate 164 and the top of upper chamber 24 to force the upper chamber downward and close the upper chamber relative to the lower chamber 26, as described more fully below. The upper air bag 220 sits on an underlying plate 222. Also, a circular wall 224 extends upwardly from the plate 222 to encircle and contain the air bag 220. It will be appreciated that a gap exists between the upper edge of the circular wall 224 and the lower surface of intermediate plate 164 to enable the air bag 220 to deflate without "bottoming" the upper edge of the wall 224 against the plate 164. As with air bag 46, the air bag 220 may be inflated and deflated in a manner well known in the art. A thin plastic sheet 226 is interposed between the underside of plate 222 and the top surface of the upper chamber 24, thereby to prevent direct contact of plate 222 with the surface of upper chamber 24, to reduce relative wear therebetween and to help maintain the cleanliness of the chamber 22. Also, the sheet can reduce shock loads that may occur as the air bag 220 is inflated and deflated.

As shown in FIG. 6, pairs of double-stepped ledges or notches 230 are found along the perimeter side edges of the upper box 28. Components of the present invention, such as valves, flow controllers, sensors, etc., may be located at these positions.

Referring to FIGS. 1 and 2, a side O-ring 236 is disposed between the outer diameter of the upper, larger diameter portion 214 of the upper chamber 24 and the inside diameter of the corresponding portion of the upper box. In addition, a pair of O-rings 238 and 240 are disposed between the underside of the shoulder portion 212 of the upper box 28 and the corresponding upper perimeter portion of the lower chamber 26 to provide a seal therebetween. O-ring seats may be formed on the upper perimeter portion of the lower chamber to receive and return the O-rings 238 and 240 therein. It will be appreciated that O-rings or similar sealing mechanisms can be utilized in additional locations between the chambers 24 and 26 and the box structures 28 and 32 and between other components of the present invention to prevent undesirable leakage of fluids.

Next, focusing on the construction of the micro processing chamber 22, as shown in FIGS. 8-11, the upper chamber 24 and lower chamber 26 are illustrated as being generally disk shaped, but could be formed in other shapes, including square, hexagonal, octagonal, etc. The upper chamber 24 is sized to be closely receivable within the central opening 210 formed in the upper box 28. Likewise, the diameter and shape of the lower chamber 26 is selected to be closely receivable within the circular cavity 118 formed in the lower box structure 32, see FIG. 5. Also, as shown in FIGS. 1 and 2, and as noted above, a large O-ring 236 encircles the circumferential exterior sidewall 250 of the upper chamber 24 thereby to seal the wall 250 relative to the corresponding inside surface of the upper box structure 28. Correspondingly, as noted above, a large diameter O-ring 144 encircles the outer diameter 252 of the lower chamber 26 to seal against the corresponding inside wall of the lower box structure 32 to form a fluid tight seal therebetween. Rather than using singular O-rings 236 and 144, multiple O-rings can be used at these locations.

Figure 10:
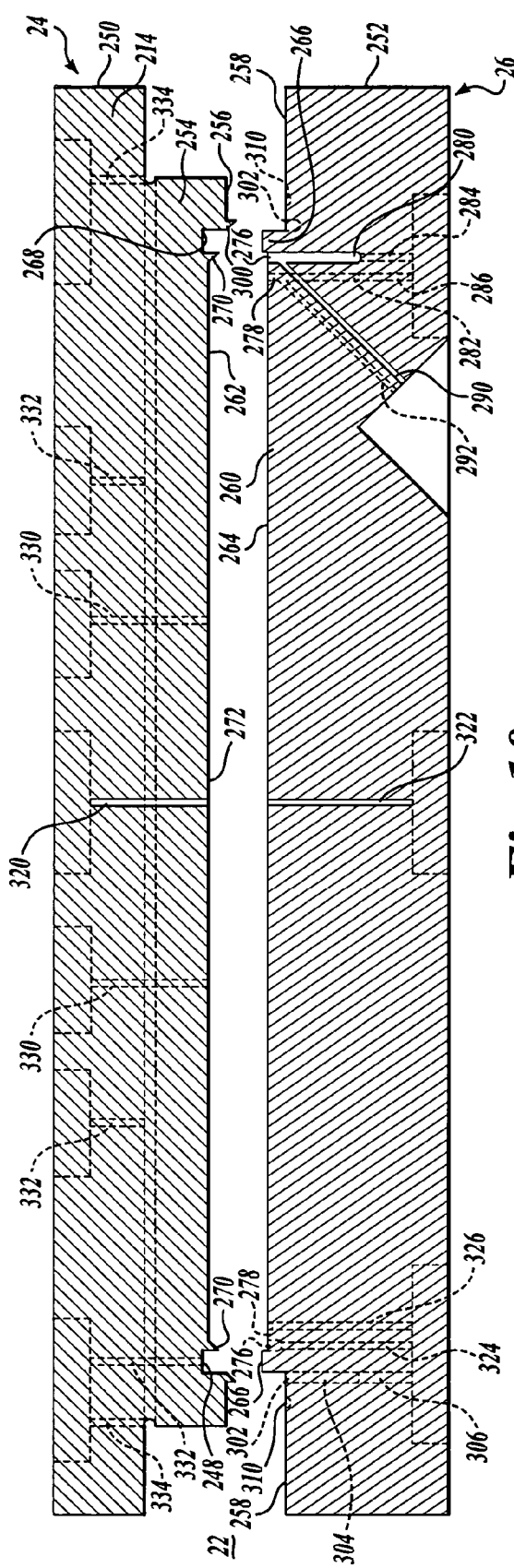
FIG. 10 is a cross-sectional view of the upper and lower chambers 24 and 26 nominally separated apart and taken substantially along lines 10-10 of FIG. 9.

As will be appreciated, the upper and lower chambers 24 and 26 are designed to match the shape of the interiors of the upper box structure 28 and lower box structure 32, respectively, and to closely fit therewith. In this regard, as shown in FIG. 10, the upper chamber 24 includes an upper ledge portion 214 that forms the largest diameter portion of the upper chamber. As described above, this ledge portion is receivable over, and is supported by, shoulder portion 212 of the upper box structure 28. The upper chamber 24 also includes a lower smaller diameter engagement portion 254 that nests with the interior diametrical wall 255 of upper box shoulder portion 212. Although not shown, O-rings can be interposed between the outer diameter of engagement portion 254 and the wall 255.

When the micro processing chamber 22 is closed, as shown in FIG. 2, the lower surface 256 of the engagement portion 254 of the upper chamber rests on the upper surface 258 of the corresponding portion of the lower chamber 26. Also, when the processing chamber is closed, a reduced diameter upper central portion 260 of the lower chamber 26 extends upwardly into engagement with a shallow cavity 262 formed in the central lower portion of the upper chamber 24. The semiconductor wafer 27, being processed rests on the upper/working surface 264 of the central portion 260 of the lower chamber 26, as discussed more fully below. A very narrow gap, in the range of about 0.001 cm to 0.5 cm, exists between the upper surface of the wafer and the surface of cavity 262. During processing of wafer 27, a similar narrow gap may exist between the underside of wafer 27 and the surface 264. Also, a narrow gap of, for example, about 0.1 to 10.0 mm, exists between the outer perimeter of the wafer and the interior of the chamber 22. In essence, the interior of the chamber 22 is substantially entirely filled by the wafer. As explained herein, by this construction, a minimum of processing fluid is needed to process and/or clean the wafer. Also, because the volume of processing or cleaning fluid needed per wafer is quite small, the level or concentration of contaminant or other substance removed from the wafer during cleaning and/or processing is greater than if typical, significantly larger volumes of processing and/or cleaning fluids were required to process/clean wafer 27.

The upper/working surface 264 is ringed by a rim 266 that extends slightly upwardly above the surface 264. The corresponding portion of the upper chamber 24 is recessed at 268 relative to the lower or working surface 272 of the central cavity portion 262 of the upper chamber, discussed below. The rim 266 preferably extends above the surface 264 a distance that is high enough to retain the wafer 27 relative to surface 264 and lower chamber 26, but not too high to make accessing the wafer for removal difficult. This height may be from about one-third the thickness of the wafer to about four times the thickness of the wafer. But for the presence of the rim 266, the wafer may not remain in position when loaded onto the surface 264, for instance if some liquid remains on the surface 264 or if air or other gas is leaking or purposefully being directed to the surface 264, for example, through passageway 322, when desiring to support the wafer above the surface 264 by use of a thin layer of air or gas.

Figure 8:
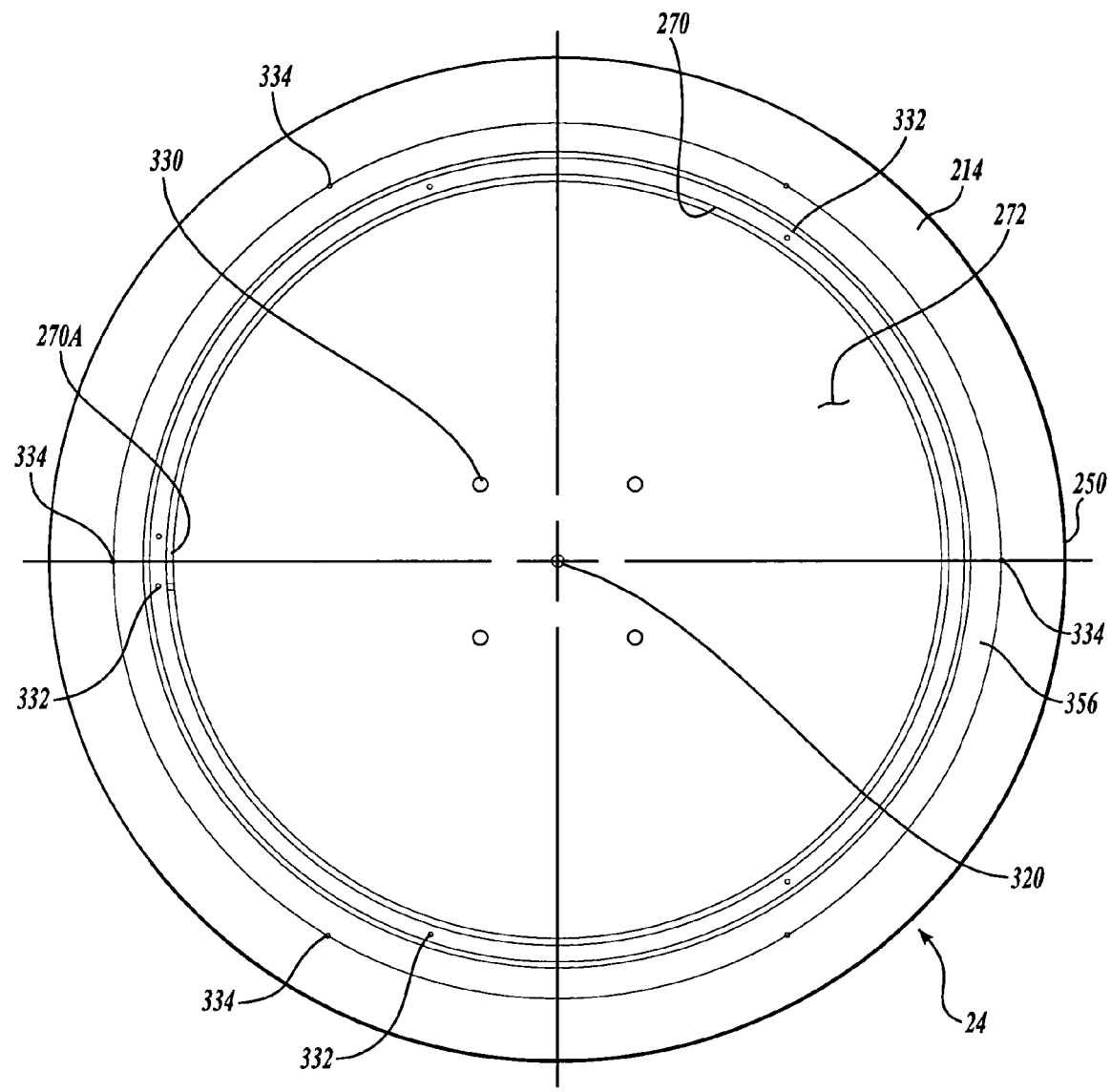
FIG. 8 is a view of the underside of upper chamber 24.
Figure 8A:
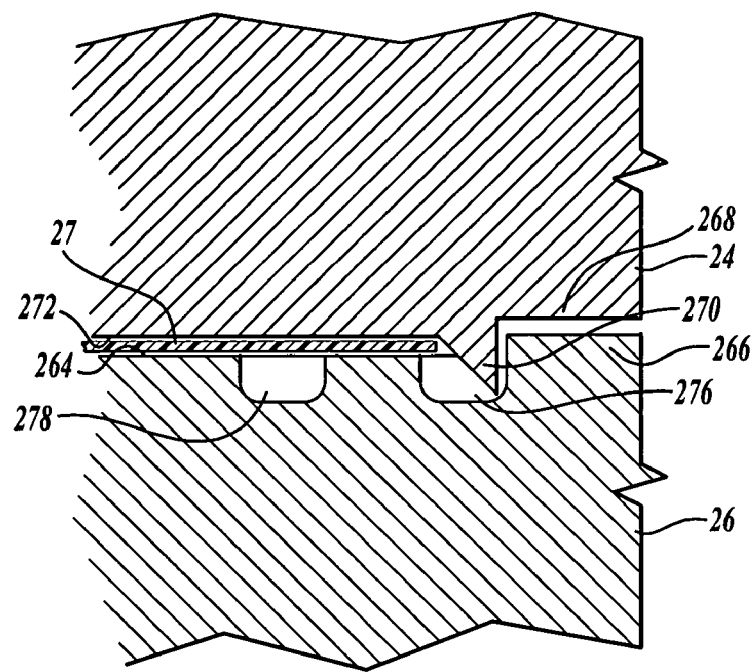
FIG. 8A is an enlarged fragmentary view of a portion of the processing chamber of the present invention shown in closed position.

Next, referring specifically to FIG. 10, the upper chamber 24 includes a circular abutment ring 270 projecting downwardly from the lower/working surface 272 of the central cavity portion 262 of the upper chamber. In cross section, the abutment ring 270 defines a generally right-triangular shape, with the hypotenuse portion of the triangle extending downwardly and diagonally outwardly relative to the center of the upper chamber 24, see also FIG. 8A. A small segment of the abutment ring, designated as 270A, is rectangular in cross section rather than triangular, as discussed more fully below, see also FIG. 8. This rectangular segment 270A is located in the 9 o'clock position, as shown in FIG. 8. The reduced diameter central portion 260 of the lower chamber is contoured relative to surface 264 into the form of a circumferential groove 276 that is sized to closely receive the abutment ring 270. When the abutment ring 270 is engaged with the groove 276, the abutment ring helps to position or locate wafer 27 on the upper surface 264 of the central portion of the lower chamber 26. The abutment ring 270 also serves to direct processing liquids or gases into groove 276 as well as into a second, inner circular groove 278 located diametrically inwardly of the groove 276. As in groove 276, groove 278 is formed by contouring portions of the lower chamber central portion below to an elevation below surface 264. However, the abutment ring portion 270A fits snugly within the corresponding portion of groove 276 to prevent processing liquids or gases to enter within that portion of the groove 276. As discussed below, this facilitates the liquids and gases in groove 276 from flowing along the groove in opposite directions away from the abutment ring section 270A. The groove 276 is of minimum depth at abutment ring section 270A and increases in depth in both directions along the groove away from ring section 270A to a maximum depth at the diametrically opposite portion of the groove.

Figure 8B:
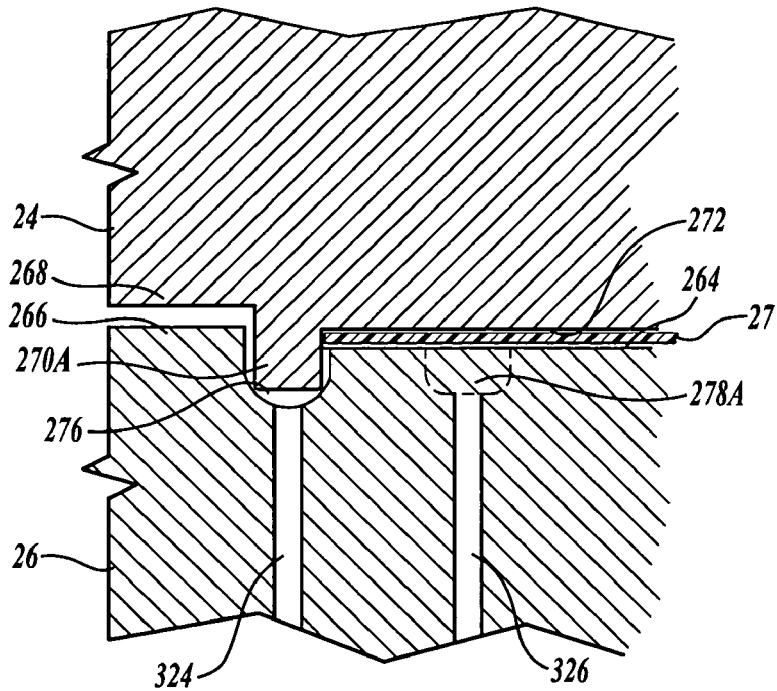
FIG. 8B is a further enlarged fragmentary view of the present invention, showing another portion of the processing chamber in closed position.
Figure 9:
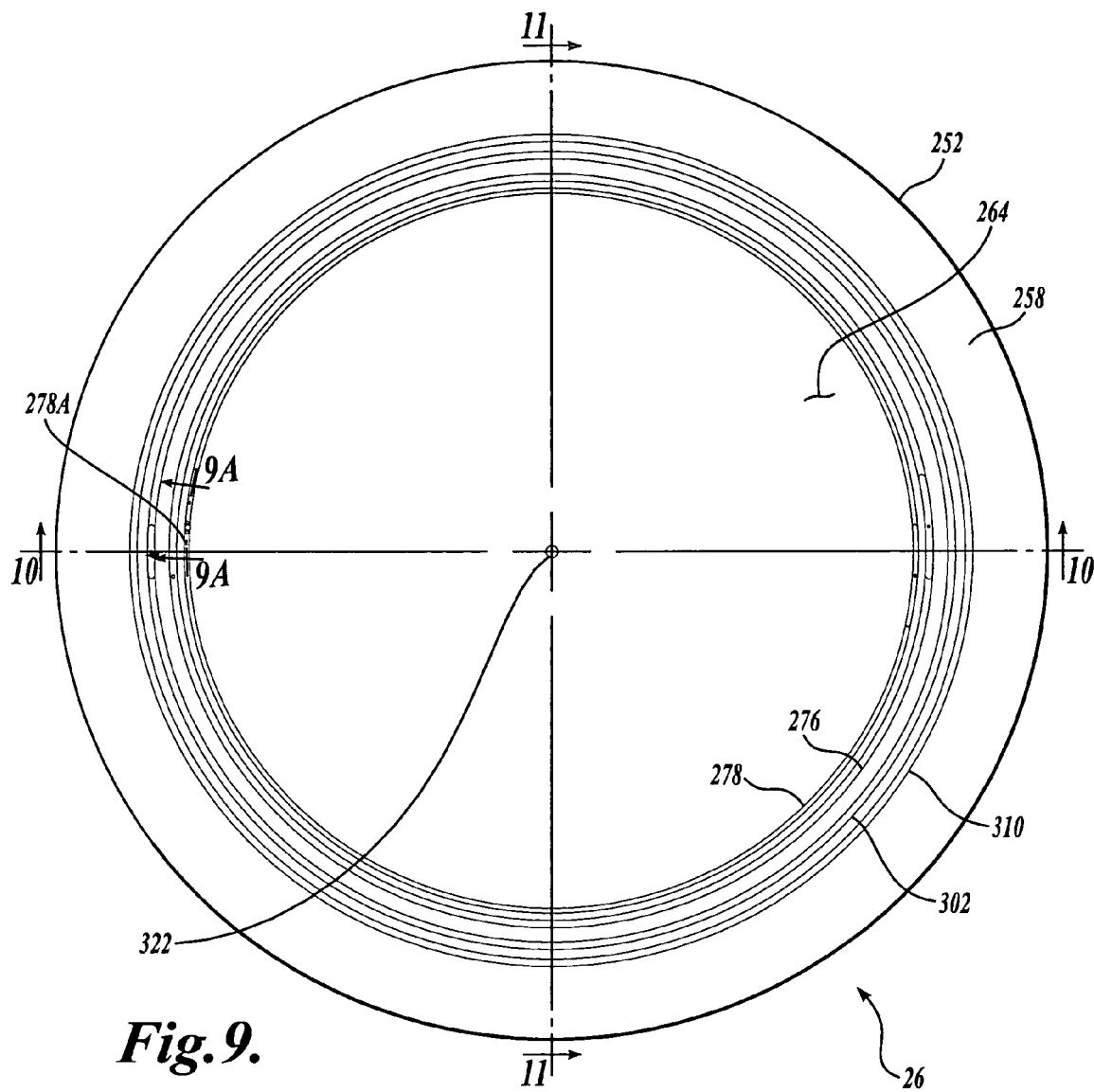
FIG. 9 is a view of the upper side of lower chamber 26, which is designed to engage with the upper chamber 24.

The inner groove 278 extends substantially around the entire diameter of the central portion 260 of the lower chamber 26, except at location 278A, as shown in FIG. 8B, there is no groove at segment 278A. This corresponds to about the 9 o'clock position shown in FIG. 9. However, the groove 278 gradually increases in depth in both directions away from the segment 278A to reach a maximum depth at the diametrically opposite portions of the groove 278 from the location of groove section 278A. Applicant has found by terminating the groove 278 at location 278A and by gradually increasing the depth of the groove in both directions away from location 278A, fluids collected in groove 278 are encouraged to flow toward the minimum depth location on the opposite side of the groove. At such maximum depth locations the inner groove 278 includes a collection sump 282 in the form of a downwardly V-shaped cavity having a width generally corresponding to the width of the groove 276. Likewise, a collection sump 280 is provided in outer groove 276, which also is in the form of a downwardly V-shaped cavity formed in the groove, see FIG. 11. In FIG. 9, the collection sumps 280 and 282 are located at the 3 o'clock position.

Figure 11:
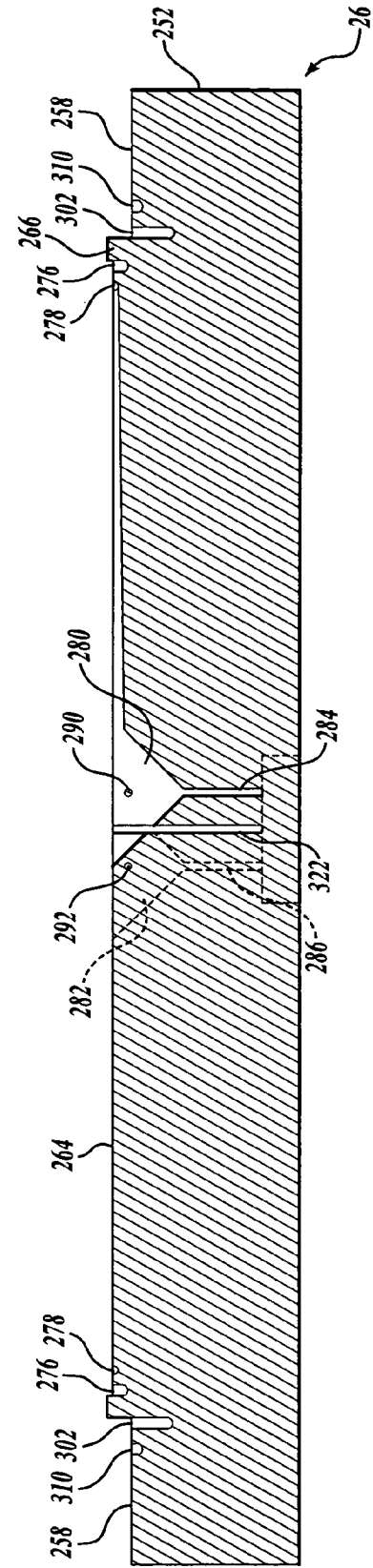
FIG. 11 is a cross-sectional view of the lower chamber 26 shown in FIG. 10, taken 90° to the view shown in FIG. 10, substantially along lines 11-11 of FIG. 9.

Continuing to refer specifically to FIGS. 10 and 11, the bottom of the outer collection sump 280 is in fluid flow communication with an outlet drain 284 extending downwardly from the bottom of the sump 280. The drain 284 may be connected to an analysis apparatus that is capable of analyzing the contaminant or other materials removed from wafer 27 during the use of the present invention. Such analysis apparatus are well-known articles of commerce, and thus will not be detailed here. The bottom of the inner collection sump 282 likewise includes an outlet drain 286 leading to a collection system for collecting the cleaning fluid, etching fluid, or other type of working fluid or gas used in the processing chamber 22 of the present invention. Also, the drain 286 may be connected to an appropriate analysis apparatus capable of analyzing the contaminant or other materials in the collected fluid.

Referring specifically to FIG. 10, exhaust outlets 290 and 292 are shown in fluid receiving communication with sidewall portions of collection sumps 280 and 282 at the upper elevations of the collection sumps. The exhaust outlets 290 and 292 collect overflow fluids (gases and liquids) from the collection sumps 280 and 282 and their corresponding collection grooves 276 and 278 to be rapidly removed. The exhaust outlets 290 and 292 extend downwardly toward the bottom of chamber 26 and radially inwardly, thereby to avoid interfering with not only grooves 276 and 278, but additional grooves formed in the lower chamber 26, described below.

Referring specifically to FIG. 10, the upper chamber 24 includes a downwardly extending outer ring 300 located radially outwardly from abutment ring 270. The outer ring 300 is located at the inward corner portion defined by lower surface 256 of engagement portion 254, and the inner diameter of cavity 262 of the central lower portion of the upper chamber. The outer ring 300 is sized to engage within the outward portion of a sealing groove 302 formed in the lower chamber 26 by contouring the upper surface of the lower chamber 258 to an elevation below the rest of the surface 258. As shown in FIG. 10, the groove 302 is adjacent the outer diameter of the reduced diameter central portion 260 of the lower chamber. The engagement of the outer ring 300 in groove 302 helps to center the upper chamber 24 relative to the lower chamber 26. In addition, the ring 300 directs fluid that may leak past groove 276 into groove 302.

As shown in FIG. 10, the ring 300 in cross section may be shaped similarly to ring 270, described above. Also, the ring 300, as well as the ring 270 may be in other cross-sectional shapes. As with grooves 276 and 278, groove 302 also varies in depth about its circumference. In this regard, the groove 302 may be shallowest at the 9 o'clock position in FIG. 9 and deepest adjacent the 3 o'clock position in FIG. 9. Also, as in grooves 276 and 278, a collection sump 304 may be formed in groove 302 at or near the 3 o'clock position shown in FIG. 9 to collect liquids and gases used in conjunction with the apparatus 20 of the present invention. The sump 304 may also be formed in a downwardly extending V-shape similar to sumps 280 and 282, described above. In addition, an outlet drain 306 is in fluid flow communication with the bottom of the sump 304 for directing collected fluids away from the sump and analyzing apparatus, a collection tank or other location.

A fourth groove 310 is formed in lower chamber 26 radially outwardly from groove 302. As with groove 302, groove 310 extends downwardly from upper surface 258 of the lower chamber. One purpose of groove 310 is to collect any fluids that may leak past grooves 276 and 302. In this regard, fluid sensors may be disposed in fluid flow communication with groove 310. Such sensors may actually be located within the groove 310 or remotely from the groove 310 and interconnected with the groove, for example, by a fluid passageway, not shown. Such sensors are well-known articles of commerce. It will be appreciated that fluid sensors may also be positioned at other locations in addition to or as an alternative to groove 310. For example, such sensors may be in fluid flow communication with sump 304 of groove 302. Such sensors can activate an alarm or stop the ongoing process or take other action if a fluid leak occurs, i.e., if processing fluid is collected within groove 310.

It will be appreciated that in addition to utilizing rings 270 and 300, other techniques may be employed to prevent leakage of processing fluid from the closed chamber 22. In this regard, O-rings or other types of seals may be employed at the juncture or interface of the upper chamber 24 with the lower chamber 26, for example, radially outwardly of the sensing groove 310.

Figure 9A:
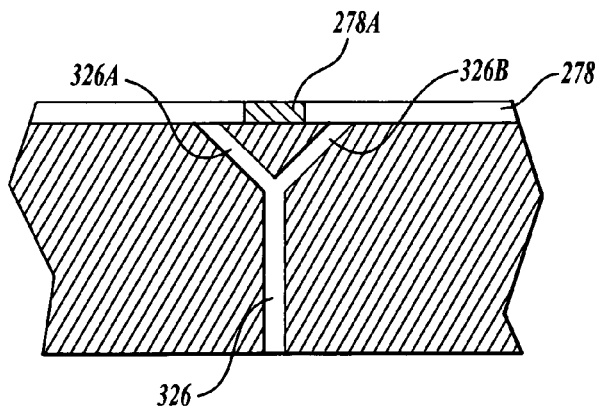
FIG. 9A is an enlarged fragmentary view of a portion of FIG. 9 taken substantially along lines 9A-9A thereof.

Processing fluid is directed to the wafer 27 by a central inlet passage 320 extending downwardly through upper chamber 24 centrally relative to the chamber. Processing fluid is directed to the underside of the wafer 27 by a central inlet passage 322 extending upwardly through the center of lower chamber 26, see FIGS. 8-11. Processing fluid introduced into the chamber 22 through openings or inlets 320 and 322, upon reaching the wafer 27, migrates radially outwardly along the wafer until reaching the outer edge or perimeter thereof and then flows into collection grooves 276 and 278. Processing fluid can also be introduced into the chamber 22 through inlet passageways 324 and 326, extending upwardly through the lower chamber 26 and into collection grooves 276 and 278 at or approximately at the 9 o'clock position, shown in FIG. 9. As shown in FIG. 9A, at the upper end of passageway 324, the passageway branches off into passageways 326A and 326B, thereby to intersect the groove 278 on opposite sides of segment 278A where no groove exists. With respect to groove 276, as long as such groove is of a depth deeper than abutment ring 270A positioned at the location that passageway 324 intersects with groove 276, then the fluid introduced through passageway 324 can flow into the processing chamber 22. It is to be understood that other inlet passageways, not shown, can also be utilized for introducing working fluid into the micro processing chamber 22.

In addition to processing fluid, the apparatus of the present invention utilizes gas to help collect the spent processing fluid and direct it out of the chamber 22. Such gas, which may be inert or active, may be introduced into the chamber 22 through inlet passageways 330 extending downwardly through upper chamber 24. The gas entering the chamber 22 through the centrally located passageways 320 will flow radially outwardly relative to the processing chamber between the underside of upper chamber 24 and the top surface of the wafer 27 until reaching the abutment ring 270, whereupon the gas will be diverted downwardly into the collecting grooves 276 and 278 to be expelled through the collection sumps 280 and 282. The gas entering the chamber 22 through inlet passageways 322 will flow radially outwardly relative to the processing chamber between the upper side of lower chamber 26 and the underside surface of the wafer 27 until reaching the abutment ring 270, whereupon the gas will be diverted into the collecting grooves 276 and 278 to be expelled through the collection sumps 280 and 282.

Gas may also be introduced into the processing micro chamber 22 through a set of inlet passageways 332 extending downwardly through the upper chamber 24 to intersect with the lower surface of the upper chamber at a location radially between abutment ring 270 and outer ring 300. As shown in FIG. 8, a number of such passageways are utilized, including at approximately the 1 o'clock, 5 o'clock, 7 o'clock, 9 o'clock, and 11 o'clock positions. Also, further gas inlet passageways 334 may extend downwardly through the upper chamber to exit the underside of the chamber at the intersection of the chamber ledge portion 214 and the reduced diameter engagement portion 254 of the chamber. Thus, these passageways direct gas to a location just inwardly of O-rings 216 and 218, see FIGS. 1 and 2. The gas, for example, inert gas, directed to processing chamber 22 through inlet passageways 332 and 334 help prevent processing fluid to migrate or leak past grooves 276 and 278, and also help direct the processing liquid collected in these grooves to move toward sumps 280 and 282. Applicant has found that by use of such gas, the processing fluid, after leaving the wafer 27, very quickly flows through the collection grooves and is collected in the sumps 280 and 282 because the gas acts as a carrier for the processing fluid.

Figure 12:
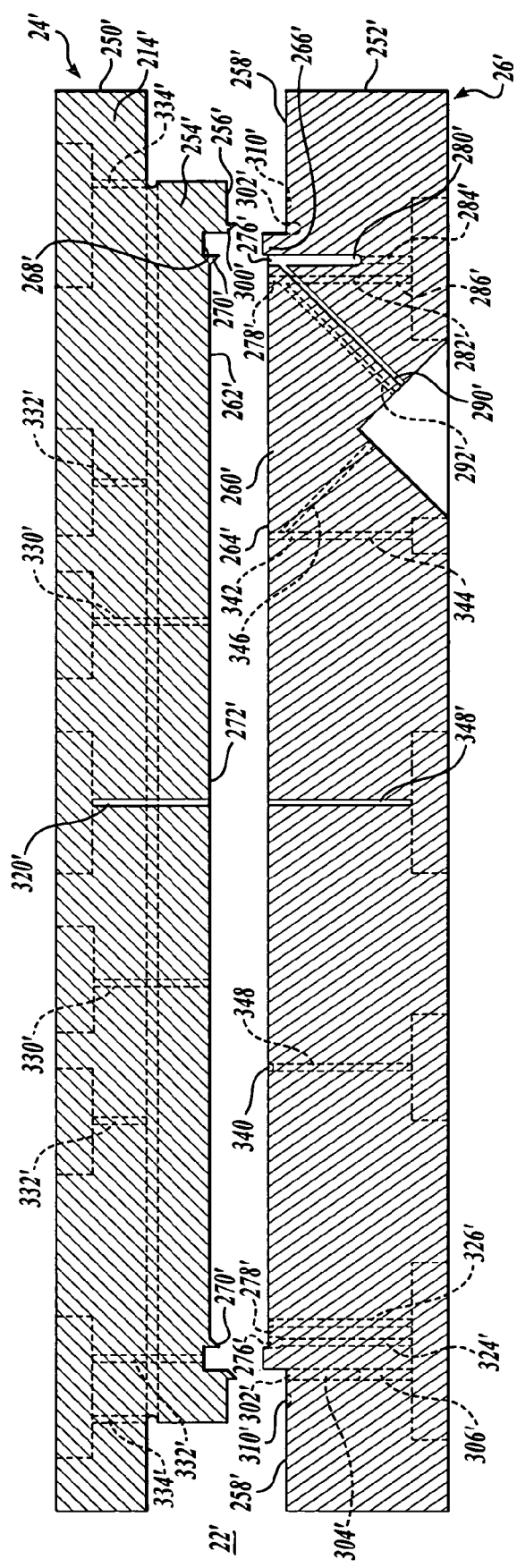
FIG. 12 is a view similar to FIG. 10, but of an alternative embodiment of the present invention.

It will be appreciated that the present invention may utilize collection grooves and/or fluid inlet passageways in addition to those described above with respect to FIGS. 8-11. One such alternative embodiment is shown in FIG. 12. In FIG. 12, the features or components of the present invention that are the same or very similar to those illustrated and described with respect to FIGS. 8-10 are given the same part number but with a prime ("'") designation. These components, features, and aspects of the invention will not be re-described here.

The processing micro chamber 22' shown in FIG. 12 does utilize a further inward fluid collection groove 340 in bottom chamber 26' of a diameter significantly smaller than the diameter of groove 278'. As with groove 278', the inward groove 340 is shallowest in the 9 o'clock position (with reference to FIG. 9) and increases in depth around the circular path of the groove to a maximum depth at the 3 o'clock position. A sump 342 is provided in the groove 340 at the 3 o'clock position. A drain passageway 344 extends downwardly from the sump 342 and may be connected with an analysis apparatus, not shown, in a manner similar to drains 284' and 286' described above. Also, an exhaust outlet 346 may be interconnected with an upper portion of the sump 342 to enable overflow fluids from the sump to be removed. Processing fluid can be introduced into the chamber 22' through an inlet passageway 348 located at about the 9 o'clock position and in alignment with groove 340. Of course the groove 340 may not utilize an inlet fluid source, but may rather be used solely for removing processing fluid from the underside of the wafer being processed.

Figure 13:
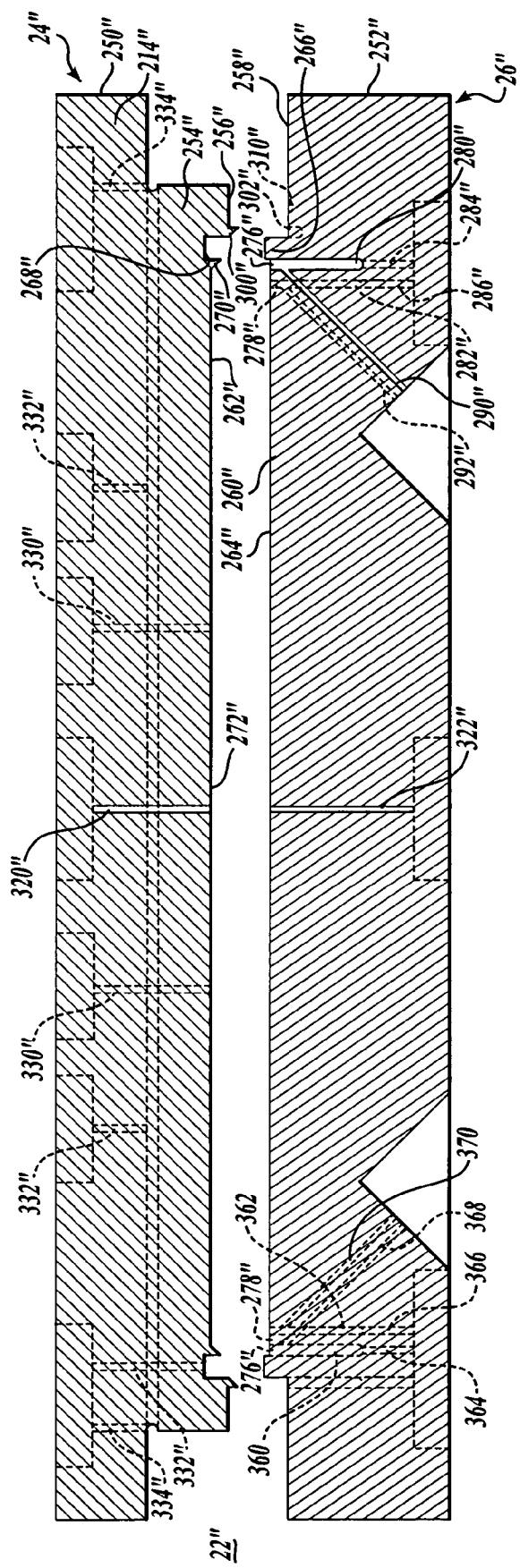
FIG. 13 is also a view similar to FIG. 10, but of a further embodiment of the present invention.

FIG. 13 illustrates another embodiment of the present invention which is similar to the embodiments shown in FIGS. 8-11, but with the use of additional sumps for the collection grooves. Those components and features shown in FIG. 13 that are the same or similar to those shown in FIGS. 8-11 are given the same part number with a double prime ("''") designation. These components and features will not be re-described here.

The embodiment of the present invention shown in FIG. 13 differs from that shown in FIGS. 8-11 in that a second sump 360 is used in conjunction with outer groove 276" and a second sump 362 is used in conjunction with inner groove 278". An outlet drain 364 is used in conjunction with sump 360, and an outlet drain 366 is used in conjunction with sump 362. In addition, an exhaust outlet 368 is used in conjunction with sump 360 and exhaust outlet 370 is used in conjunction with sump 362.

In the embodiment of FIG. 13 the sumps 280" and 282" may be located at about the 3 o'clock position, whereas the sumps 360 and 362 may be located at the 9 o'clock position, in relation to FIG. 9. In this regard, the grooves 276" and 278" may be the shallowest at approximately the 12 o'clock and 6 o'clock positions and becoming deeper in the directions towards the 3 o'clock and 9 o'clock positions. Moreover, inlet passageways, not shown, corresponding to inlet passageways 324 and 326 shown in FIG. 10, may be located at the 12 o'clock and 6 o'clock positions. It is expected that the embodiment shown in FIG. 13 may be capable of handling more processing fluid or collecting the processing fluid at a faster rate than the embodiment of the present invention shown in FIGS. 8-11. Also, the embodiments shown in FIG. 13, utilizing duplicate analysis apparatus, can provide a redundant system capable of verifying the analysis results or quick studying of the thin film uniformity.

To use the present invention to process and/or clean semiconductor wafers, such as wafer 27, the processing micro chamber 22 is opened by lowering the lower box structure 32. This is accomplished by deflating lower air bag 46. Upon such deflation, the combined weight of the lower box 32 and lower chamber 26 will cause the lower box to retract downwardly, being guided by posts 80. Once the chamber 22 is opened, a semiconductor wafer can be placed on top surface 264 of the lower chamber 26. Thereafter the box structure is closed by raising the lower box 32 by inflating the air bag 46. Upon inflation, the lower box structure 32 and corresponding lower chamber 26 rise upwardly relative to the upper chamber 24 and upper box structure 28. The upward movement of the lower box structure 32 and corresponding lower chamber 26 continues until the upper surface of the lower box mates with the lower surface of the upper box, see FIG. 2. When this occurs, the circumferential upper surface 256 of the lower chamber abuts against O-rings 238 and 240 which are interposed between such surface and the underside of the shoulder portion 212 of the upper box 28.

At this point, the micro chamber 22 is actually closed and is about at its maximum volume, FIG. 2. Closure of the micro chamber is accomplished in two ways. As a first way, the upper and lower boxes 28 and 32 are sealed relative to each other by O-ring 146A. In addition, the sidewall of the upper chamber is sealed relative to the upper box by O-ring 236, and the sidewall of the lower chamber 26 is sealed relative to the lower box by O-ring 144. In this manner, the chamber is sealed relative to the exterior. As a second way, O-rings 216 and 218 seal the upper chamber 24 relative to the upper box 28, and O-rings 238 and 240 seal the lower chamber relative to the upper box, which in turn creates a second seal for the interior of the chamber.

Thus, the interior of the micro chamber is sealed. Further, the volume of the interior of the micro chamber can be selectively varied through the use of the upper air bag 220. To reduce the volume or the size of the gaps between the upper surface of the wafer 27 and the surface of cavity 262, and between the underside of the wafer 27 and the surface 264, the upper air bag 220 is inflated, which then presses downwardly on the upper surface of the upper chamber 24, forcing the upper chamber downwardly towards the lower chamber 26. This causes the upper, larger diameter portion 214 of the upper chamber downwardly toward the shoulder portion 212 of the upper chamber box structure 28. As shown in FIGS. 1 and 2, the O-rings 216 and 218 interposed between the underside of the larger diameter portion 214 of the upper chamber and the upper surface of shoulder 212 of the upper box, compress as the upper chamber shifts downwardly toward the lower chamber. When the size of the micro chamber 22 is thus reduced, a sufficient gap still exists between the lower surface of the upper chamber 24 and the upper surface of the lower chamber 26 to accommodate the wafer 27. The clearance gap between the surfaces of the wafer and the corresponding surfaces of the chamber may vary depending on the type of process or cleaning that is occurring, but is nonetheless always quite narrow and is usually consistent. For example, this gap may be from between 0.5 cm to 0.001 cm.

Next, processing fluid may be introduced into the micro chamber 22 through inlet lines 320 and 322 positioned at the centers of the upper and lower chambers 24 and 26. As noted above, alternative or additional inlet lines may be utilized. The inlet lines may deliver processing fluids (liquids or gases) as well as cleaning and drying fluids (liquids or gases) to the micro chamber 22. These fluids, upon entering the chamber, flow radially outwardly relative to the micro chamber and the semiconductor wafer towards the outer periphery thereof. The inlet lines may also be connected to a vacuum system when vacuuming the chamber or holding the wafer is needed.

Either before or after the start of the flow of processing fluids into the micro chamber 22, gas may be introduced into the chamber through inlet passageways 330 and/or 320 and 322, and/or other passageways. Applicant has found that use of a gas in this manner causes the spent processing fluid to move rapidly radially away from the wafer outer edge and into the collection grooves 276 and 278, and also causes the fluids in the collection grooves to move rapidly towards collection sumps 280 and 282. From these sumps, the collected fluids may be analyzed by appropriate instruments. Applicant has found that the flow of processing fluids through the micro chamber 22, the collection grooves 276 and 278, and into the sumps 280 and 282 is so rapid, that analysis of the chemical processing or cleaning of the wafer occurs on a real-time basis This has significant advantages over prior art systems wherein processing fluids are collected and then analyzed "after the fact." In those situations, processing times must be estimated and cannot be controlled on a real-time basis as in the present invention.

The present invention also contemplates the possibility of applying a vacuum to the outlet drains of micro chamber 22, for instance, through exhaust outlet 290 and exhaust outlet 292. If a vacuum is applied to these exhaust outlets, the spent processing fluids may be urged to flow from the wafer 27 into the collection grooves, for instance grooves 276 and 278, through the grooves and into collection sumps 280 and 282, then through the outlet drains 284 and 286. Such spent fluid is then available for immediate analysis. Alternatively, such collected spent processing fluid may be stored for subsequent analysis or disposal.

Gases, for example, inert gases, may also be supplied to processing micro chamber 22 through inlet lines 332, positioned between abutment ring 270 and outer ring 300 as well as through inlet lines 334, positioned just inwardly of sealing O-rings 216 and 218. As explained above, the introduction of gas in inlet lines 332 and 334 helps prevent leakage of processing fluids at the perimeter of the micro chamber 22. However, if processing fluid does leak past abutment ring 270 and outer ring 300, when such fluid reaches sensing groove 310, the presence of such processing fluid will be detected.

This can result in selected events, such as the sounding of an alarm, the automatic shutting off of processing fluid to micro chamber 22, etc.

The foregoing method can be used to sequentially introduce different processing/ cleaning fluids into the micro chamber 22, and some or all of these processing fluids can be analyzed on a real-time basis through the use of the present invention.

Once the processing or cleaning of the wafer 27 has been completed, the wafer may be removed from the processing chamber by deflating the upper air bag 220 as well as the lower air bag 46, thereby causing the lower box structure 32 and corresponding lower chamber 26 to descend relative to the upper box structure 28 and corresponding upper chamber 24, thereby providing access to the interior of the processing chamber. The wafer 27 therein can be conveniently removed and replaced with another wafer.

Also, the present invention contemplates processing and/or cleaning wafers of different sizes. This may require replacing the upper and lower chambers 24 and 26 with other chambers that are capable of accommodating wafers of different sizes. Through the construction of the present invention, the removal of the upper and lower chambers may be readily accomplished. In this regard, with the lower air bag 46 deflated, the lower chamber 26 may be lifted out of the lower box 32. In addition, the upper box 28 may be detached from clamping plate 204 to enable the upper box to slide downwardly relative to posts 80 so that the upper chamber 24 can then be lifted out of the upper box 28.

The present invention can serve several purposes. For example, by combining with other detection components or system, the present invention can be used to determine or analyze trace contamination or materials, organic or inorganic, on the wafer surface or in the wafer, as well as on the front side or back side or edge of a wafer. The present invention can be employed to study or analyze the reactions that occur between the processing fluid and the wafer on a real-time basis since the processing fluid is quickly collected rather than merely accumulating in a collection groove. Thus, it is possible to monitor the change in reaction between the processing fluid and a wafer over time on a real-time basis.

As an example of a specific use, the present invention can be employed to monitor wet chemical etching of thin film copper using Inductive Coupled Plasma-mass spectrometry (ICP-MS) or Inductive Coupled Plasma-time-of-flight mass spectrometry (ICP-TOFMS). In this process, etching fluid, composed of a mixture of desired chemicals, hydrogen peroxide, nitric acid, and hydrofluoric acid, is introduced into the processing micro chamber 22 through inlet passage 322 and/or 320, depending on which side of the wafer is to be analyzed or through inlet passage 324 and 326 for analyzing the edge of wafer. This etching fluid reacts with the copper thin film while slowing radially outwardly toward the collection grooves 276 and 278. The spent fluid collected in the collection sump 280 and/or 282 is directed to an on-line ICP-MS testing unit. The results of this monitoring and analysis is graphed in FIGS. 14A through 14E. These figures give information about the thin film being tested. In the graph of FIG. 14A, the value A, the concentration of copper, is directly related to the etching rate with the particular fluid, i.e., the mixture of hydrogen peroxide, nitric acid, and hydrofluoric acid on the copper thin film. In the graph of FIG. 14A, the value B is related to the thickness of the thin film, since this represents the time required for the maximum concentration of copper being removed from the substrate to start to decrease. The value C, which is the time it takes the reduction of the concentration of copper in the effluent to reach one-half the maximum concentration, is related to the density of the thin film on the substrate. Moreover, the shape or slope D is related to the strength of bonding of the thin film on the substrate. The stronger the bond, the less steep the slope D. It will be appreciated that the thin film wet etching profile plotted in the graph of FIG. 14A can be used for studying the etching process. This plot can also be used to determine ways to improve the yield of the process by analyzing the results of different factors on the process to control the quality of the process, as well as to monitor the operation of the equipment used in the process.

The present invention can also be used to monitor for trace contaminants or other elements present on the substrate. In this regard, see the plots of FIGS. 14B and 14C. The plot of FIG. 14B corresponds to a second element being monitored, whereas the plot of FIG. 14C, being a spike early in the analysis process, indicates the presence of contamination on the surface of the thin film.

The plot of FIG. 14D indicates a further contaminant. This contaminant, however, is present throughout the entire copper layer, since its presence is detected throughout the etching process. The present invention can also tell if a contamination occurred at the beginning of the copper thin film process. For example, the plot of FIG. 14E shows the presence of a contaminant that only is detected at the very end of the etching process.

Wafer cleaning is fundamental to semiconductor manufacturing. It is one of the most frequently conducted process steps. The smaller features now being incorporated into semiconductors, the use of thinner gate stacks, and the use of new materials, are forcing creation of new ways of cleaning and drying semiconductor wafers. The present invention also can be used to prepare ultra-clean surfaces on the wafer before or after critical processes, such as gate oxide cleaning, and can be used to monitor the progress of the wafer cleaning process. During this process, cleaning fluid that could be a liquid, gas, organic solvent or inorganic chemical mixture, is introduced into the processing chamber through inlet passages 320 and 322 either sequentially or simultaneously. During the cleaning process, the cleaning liquid (or other fluids) sequentially flows radially outwardly toward the collection grooves 276 and 278. The fluid flow rate and flow motion character can be precisely controlled by computer programmable pumps and the gap sizes between the wafer and the working surfaces of the chamber are affected by the pressure applied on the upper chamber from the air bag 220. Heating and vacuum techniques can be utilized during the process to enhance the cleaning and drying efficiency.

As noted above, the cleaning fluid reaching the radially outwardly edges of the wafer 27 is rapidly collected in the inner and outer collection sumps 282 and 280. In this use of the present invention, not only can both sides of the wafer surface be simultaneously cleaned, but also the edge of the wafer can also be cleaned. If the fluid collected in one or both of the inner and outer collection sumps 282 and 280 is directed to a testing apparatus, the contaminant being removed from the wafer can be monitored in real time by testing equipment, and once the contaminant in the cleaning fluid falls to a desired level, the cleaning process can be terminated. With on-line detectors, the cleaning of wafers 27 can be achieved with minimum usage of chemicals and minimum processing time. In the past, it was only possible to estimate the length of time needed to properly clean the wafer, which time duration, by necessity, had to account for the worst case scenario. As such, in many instances, the cleaning process continued for significantly longer than required, causing not only inefficiencies, but also a waste of cleaning fluid.

A further aspect of the present invention may also be advantageously utilized to clean semiconductor wafers. In modern semiconductor design relatively deep holes or cavities are formed in the semiconductor structure which require cleaning. These cavities may resist cleaning if the cleaning fluid is simply transmitted across the semiconductor surface. In this regard, the air or other gas trapped in the hole or cavity may not allow the cleaning fluid to fully enter the hole or cavity. However, cleaning of the holes or cavities may be enhanced by applying a pumping action to the chamber 22 by inflating and deflating the upper air bag 220. Such pumping action can assist in releasing the gases trapped in the deeper portions of the holes or cavities and force the cleaning fluid deep into the cavities of the semiconductor wafer to augment the cleaning thereof.

The present invention can also be used for other processing purposes, such as chemical etching. The micro volume of the process chamber not only substantially reduces the usage of process chemicals and ultra-pure water that leads to reduced generation of wastes that require treatment, but also provides better control of the process being used. The chemical reactions being used can be stopped or changed very quickly (perhaps within seconds) by simply replacing the fluid in the micro chamber with different chemistry fluids or different state of fluids). In this regard, some of the effluent from the etching process is collected in a collection sump, for example sump 280, and then analyzed in real time with on-line detectors. When the desired amount of etching has been completed, the composition of the material being removed from the wafer 27 will change thereby to indicate that etching has been, or is close to being, completed, and the process can be terminated at that time or within a fixed time.

As will be appreciated, the real-time analysis of the effluent from the etching process makes some manufacturing procedures possible. For example, if there is a need for a process that will precisely etch a particular thin film to its half thickness, this is very difficult to achieve on a consistent basis using existing processing techniques. With the on-line detector system of the present invention, the amount of material of the thin film etched away can be closely monitored. The detector system of the present invention can provide the endpoint of the process when on-line testing/monitoring shows that half of the starting material had been etched away.

It will be appreciated that the present invention can provide valuable information on a real-time basis concerning the cleaning and/or processing of semiconductor wafers that heretofore had not been possible.

Besides its broad application in the semiconductor industry, the present invention is also applicable to fields other than the semiconductor industry. One such field is in separating mixtures of substances by chromatography techniques.

Chromatography is one of the most powerful separation techniques in modern science. The feature that distinguishes chromatography from most other physical and chemical methods of separation is that two mutually immiscible phases are brought into contact: one phase is stationary and the other phase is mobile. In chromatography, a sample to be separated is introduced into a mobile phase and then carried along through a column containing a distributed stationary phase or a coating of a thin film constituting a stationary phase applied to the column surface. Species in the sample undergo repeated partitions between the mobile phase and the stationary phase while they travel through the column. When both phases are properly chosen, the species in the sample are gradually separated into groups that appear as bands in the mobile phase. The species that partitions the least at the stationary phase will come out of the column first, and the specie that partitions the most at the stationary phase will come out of the column last.

In the present invention, the lower surface 262 of upper chamber 24 and the upper surface 264 of lower chamber 26, or the surfaces of wafer 27, all could be utilized as the column in general chromatography and thus be coated with a thin film of a stationary phase material. Fluids can be used as the mobile phase. A sample may be introduced from the center inlet passage 320 or 322 by an injection valve connected to the inlet passage 320 or 322. The fluid that carries the sample flows radially toward and past the edge of wafer 27 and then is rapidly collected in the inner or outer collection sumps 282 and 280. The separation efficiency could be improved by diminishing the size of the gap through which the liquid phase flows, by increasing the diameter of the stationary phase and by optimizing the chemistry of the liquid phase.

One of the unique features of the present invention as used for chromatography is the very low operational pressure that could be required, less than 200 psi with a gap size around 0.01 to 0.05 mm for a wafer diameter of about 300 mm. In comparison, general liquid chromatography methods use a 2 mm diameter column of 300 mm length, and operate at a pressure of more than 1000 psi. Still, the mobile phase flow rate is only about 1 ml/min.

Moreover, the high operation pressure of current chromatography systems requires components and equipment that can withstand high pressures. Such equipment is very expensive. Also, such equipment is complicated in design and operation. Thus, the ability to perform chromatography at lower pressure with the present invention provides significant advantages.

While preferred embodiments of the invention have been illustrated and described, it will be appreciated that various changes can be made therein without departing from the spirit and scope of the invention.

The embodiments of the invention in which an exclusive property or privilege is claimed are defined as follows:

1. An apparatus for chemically processing a semiconductor wafer comprising:
   (a) a micro chamber in which a semiconductor wafer is closely received and processed, said chamber comprising a first section having portions defining an upper working surface and an upper interior perimeter, and a second section having portions defining a lower working surface and lower interior perimeter, said processing chamber shiftable between an open position for receiving and removing the semiconductor wafer therefrom and a closed position for closely receiving the semiconductor wafer for chemical processing;
   (b) wherein when said chamber is in closed position, the semiconductor wafer is disposed between the upper working surface and lower working surface to define a narrow gap between the upper working surface and the adjacent surface of the semiconductor wafer and/or a narrow gap between the lower working surface and the adjacent surface of the semiconductor wafer and/or a narrow gap between the outer perimeter of the semiconductor wafer and the interior perimeters of the chamber first and/or second sections;
   (c) at least one entrance opening in the chamber first section and/or chamber second section for directing processing fluids into the chamber;
   (d) wherein the chamber second section is contoured so that portions of the lower working surface are at an elevation below the remainder of the lower work surface to serve as a collection location for spent processing fluid;

(e) an outlet in fluid flow communication with the collection location of the chamber second section to direct spent processing fluid away from the chamber, and (f) at least one entrance opening in the chamber for directing gas into the chamber, said gas acting as a carrier for the processing fluid to carry the processing fluid into the collection location;

wherein the lower interior perimeter comprises a rim that extends slightly upwardly above the lower working surface of the second section; and a corresponding recessed portion of the first section is located so as to receive at least a portion of the rim when the micro chamber is in the closed position;

wherein the upper interior perimeter comprises a circular abutment ring, projecting downwardly, and disposed diametrically inwardly from the rim, the abutment ring having a cross section that defines a generally right-triangular shape, with the hypotenuse portion of the triangle extending downwardly and diagonally outwardly relative to the center of the upper working surface, and the abutment ring having a segment that is rectangular in cross section;

wherein the contoured chamber second section includes portions that define at least a first groove and a second groove; the first groove located diametrically inward of the second groove; the second groove located such that it is diametrically inward of the rim; and the second groove aligned with the abutment ring when the chamber is in the closed position.

2. The apparatus according to claim 1, wherein said at least one entrance opening in the chamber for directing gas into the chamber, comprises at least one entrance opening in the first section and/or second section of the chamber.

3. The apparatus according to claim 1, wherein the collection location of the chamber second section define a sump in communication with said first groove for collecting spent processing fluid entering said first groove.

4. The apparatus according to claim 3, further comprising a drain in fluid flow communication with said sump for directing spent fluid away from said sump.

5. The apparatus according to claim 3, wherein said first groove is positioned radially inwardly of the outer edge of the semiconductor wafer, and at least a portion of the second groove is positioned radially outwardly of the semiconductor wafer.

6. The apparatus according to claim 1, further comprising a drainage system for rapidly removing processing fluid collected in the first groove.

7. The apparatus according to claim 6, wherein the first groove terminates for a segment of the perimeter of the semiconductor wafer at a location distal from the location that the outlet communicates with the groove.

8. The apparatus according to claim 1, wherein said first section is disposed primarily above the semiconductor wafer and said second section is disposed primarily below the semiconductor wafer.

9. The apparatus according to claim 1, further comprising a closure system for opening and closing the processing chamber, said closure system comprising a lifting subsystem for lifting the chamber second section into closed position beneath the chamber first section, and also for retracting the chamber second section from the chamber first section to open the chamber.

10. The apparatus according to claim 9, further comprising a fluid bladder positioned beneath the chamber second section for raising the chamber second section upwardly relative to the chamber first section to close the chamber and for lowering the chamber second section relative to the chamber first section to open the chamber.

11. The apparatus according to claim 10, wherein the fluid bladder comprises an air bag positioned beneath the chamber second section.

12. The apparatus according to claim 11, further comprising a second air bag apparatus positioned above the chamber first section to apply force against the chamber top section when the chamber is in closed position to control the size of the chamber.

13. The apparatus of claim 1, further comprising:
an upper box structure for receiving and supporting the chamber first section; and
a lower box structure for receiving and supporting the chamber second section, said upper and lower box sections relatively movable toward each other during closure of the chamber, and movable away from each other during opening of the chamber.

14. The apparatus according to claim 13, further comprising a guide system for supporting and guiding the chamber upper and lower box sections during relative movement of the upper and lower chamber box sections during opening and closing of the chamber.

15. The apparatus according to claim 14, further comprising at least one fluid bladder for powering the upper and lower box structures toward each other during closing of the chamber, and retracting the upper and lower chambers away from each other during opening of the chamber.

16. The apparatus according to claim 15, wherein said fluid bladder comprising at least one air bag disposed relative to the lower box structure to raise the lower box structure and corresponding chamber second section upwardly towards the upper box section and chamber first section for closure of the chamber, and correspondingly for retracting downwardly the lower box structure and corresponding chamber second section during opening of the chamber.

17. The apparatus according to claim 16, further comprising another air bag disposed relative to the upper box structure to force the upper box structure and the corresponding chamber first section downwardly towards the lower box section and chamber second section for closure of the chamber, and correspondingly for retracting upwardly the upper box structure and corresponding chamber first section during opening of the chamber.

18. The apparatus of claim 1, wherein the rim has a height, and the height is between one-quarter of the thickness of the semiconductor wafer and four times the thickness of the semiconductor wafer.

19. The apparatus of claim 1, wherein the first groove is circularly continuous except at a predetermined location occupied by a non-grooved segment.

20. The apparatus of claim 19, wherein the first groove increases in depth in both directions away from the non-grooved segment.

* * * * *